(12) United States Patent
Deguchi et al.

(10) Patent No.: US 10,553,283 B2
(45) Date of Patent: Feb. 4, 2020

(54) SEMICONDUCTOR STORAGE DEVICE

(71) Applicant: TOSHIBA MEMORY CORPORATION, Tokyo (JP)

(72) Inventors: Yoko Deguchi, Yokohama Kanagawa (JP); Kosuke Yanagidaira, Fujisawa Kanagawa (JP); Tadashi Yasufuku, Kawasaki Kanagawa (JP); Takuyo Kodama, Sagamihara Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/116,727

(22) Filed: Aug. 29, 2018

(65) Prior Publication Data

US 2019/0355421 A1  Nov. 21, 2019

(30) Foreign Application Priority Data

May 16, 2018 (JP) .................. 2018-094551

(51) Int. Cl.
*G11C 16/04* (2006.01)
*G11C 29/02* (2006.01)
*G11C 16/24* (2006.01)
*G11C 16/30* (2006.01)

(52) U.S. Cl.
CPC .......... *G11C 16/0483* (2013.01); *G11C 16/24* (2013.01); *G11C 16/30* (2013.01); *G11C 29/021* (2013.01); *G11C 29/028* (2013.01)

(58) Field of Classification Search
CPC ..... G11C 16/0483; G11C 16/24; G11C 16/30; G11C 16/021

USPC ...................................................... 365/185.25
See application file for complete search history.

(56) References Cited

U.S. PATENT DOCUMENTS

| 7,324,393 | B2* | 1/2008 | Chan ..................... | G11C 7/062 365/185.21 |
|---|---|---|---|---|
| 8,391,077 | B2 | 3/2013 | Tanaka et al. | |
| 8,902,662 | B2 | 12/2014 | Shiga et al. | |
| 9,536,617 | B2 | 1/2017 | Al-Shamma et al. | |
| 2012/0290864 | A1* | 11/2012 | Seroff .................. | G06F 1/3206 713/340 |

FOREIGN PATENT DOCUMENTS

WO  2017/046850 A1  3/2017

* cited by examiner

*Primary Examiner* — Vu A Le
(74) *Attorney, Agent, or Firm* — Kim & Stewart LLP

(57) ABSTRACT

According to one embodiment, a semiconductor storage device includes a first plane having a first plurality of memory cells, a second plane having a second plurality of memory cells, first bit lines which are connected to the first plane, second bit lines which are connected to the second plane, a plurality of first sense amplifiers which charge the plurality of first bit lines, and a plurality of second sense amplifiers which charge the plurality of second bit lines. When the first and second planes operate in parallel, a total sum of currents supplied to the plurality of first bit lines from the plurality of first sense amplifiers and currents supplied to the plurality of second bit lines from the plurality of second sense amplifiers reaches a first current value, then decreases to a second current value, and then increases to a third current value.

20 Claims, 17 Drawing Sheets

SEMICONDUCTOR STORAGE DEVICE

CROSS-REFERENCE TO RELATED APPLICATION

This application is based upon and claims the benefit of priority from Japanese Patent Application No. 2018-094551, filed May 16, 2018, the entire contents of which are incorporated herein by reference.

FIELD

Embodiments described herein relate generally to a semiconductor storage device.

BACKGROUND

A NAND type flash memory has been known as a kind of semiconductor storage device. In addition, there has been known a NAND type flash memory having a plurality of memory cells stacked three-dimensionally.

DETAILED DESCRIPTION

Figure 1:
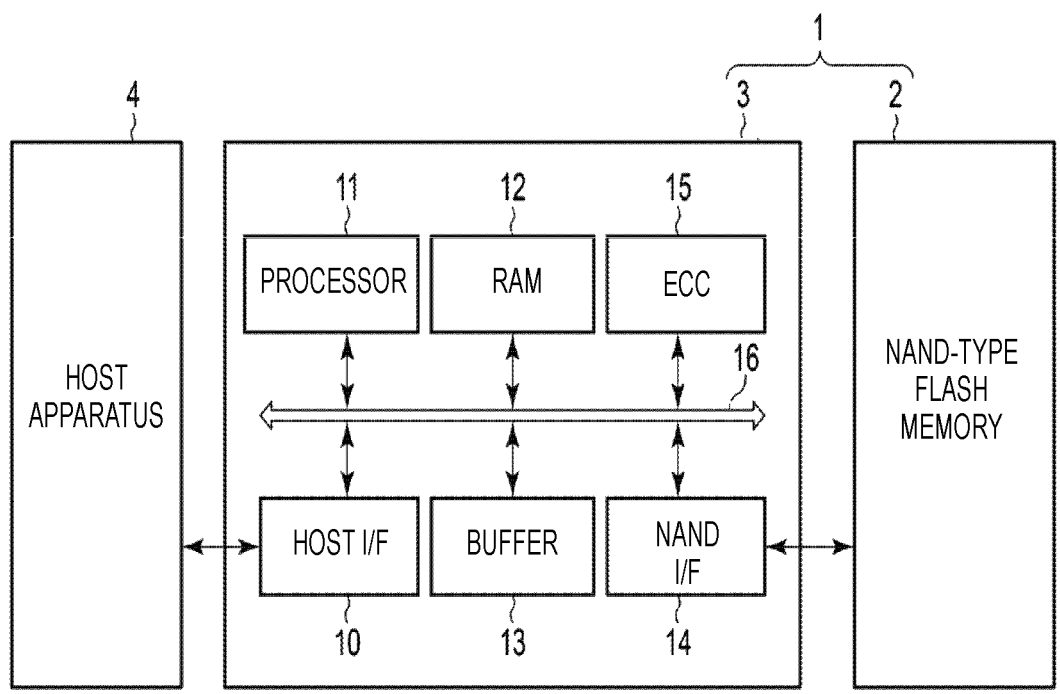
FIG. 1 is a block diagram of a memory system according to a first embodiment.

In general, according to one embodiment, a semiconductor storage device, comprising: a first plane which includes a first plurality of memory cells; a second plane which includes a second plurality of memory cells; a plurality of first bit lines which are connected to the first plane; a plurality of second bit lines which are connected to the second plane; a plurality of first sense amplifiers which charge the plurality of first bit lines; and a plurality of second sense amplifiers which charge the plurality of second bit lines. When the first and second planes operate in parallel, a total sum of currents supplied to the plurality of first bit lines from the plurality of first sense amplifiers and currents supplied to the plurality of second bit lines from the plurality of second sense amplifiers reaches a first current value, then decreases to a second current value, and then increases to a third current value.

Hereinafter, embodiments will be described with reference to the drawings. Example embodiments are described below for purposes of explaining features of the present disclosure. The scope of the present disclosure is not limited to the particular shapes, structures, arrangements, and the like of constituent components of the example embodiments. In general, functional blocks and units described herein may be realized by as hardware, software, or a combination thereof. Some functions may be performed by a functional block separate from the described functional blocks. Further, the described functional blocks may be divided into smaller functional sub-blocks. In the following description, constituent elements having the same functions and the same configurations will be denoted by the same reference numerals, and repeated descriptions thereof will be performed only when necessary.

[1] First Embodiment

[1-1] Configuration of Memory System 1

FIG. 1 is a block diagram of a memory system 1 according to a first embodiment. The memory system 1 has a NAND type flash memory 2, and a memory controller 3.

The memory system 1 may comprises a plurality of chips mounted on a motherboard, or other substrate, on which a host device is also placed, or the memory system 1 may instead be a large-scale integrated (LSI) circuit or a system-on-chip (SoC) that implements the memory system 1 as a single module. Examples of the memory system 1 may include a memory card such as an SD™ card, a solid state drive (SSD), or an embedded multimedia card (eMMC).

The NAND type flash memory 2 has a plurality of memory cells (also called memory cell transistors) and stores data in a non-volatile manner. A specific configuration of the NAND type flash memory 2 will be described below.

In response to a command from the host device 4, the memory controller 3 commands the NAND type flash memory 2 to write (also referred to as a program operation), read, and erase the data. In addition, the memory controller 3 manages a memory space of the NAND type flash memory 2. The memory controller 3 has a host interface circuit (host I/F) 10, a processor 11, a random access memory (RAM) 12, a buffer memory 13, a NAND interface circuit (NAND I/F) 14, an error checking and correcting (ECC) circuit 15, and the like. These modules are connected to one another through a bus 16.

The host interface circuit 10 is connected to the host device 4 through a host bus and performs interface processing between the host device 4 and the host interface circuit 10. In addition, the host interface circuit 10 transmits and receives commands, addresses, and data between the host device 4 and the host interface circuit 10.

The processor 11 is, for example, a central processing unit (CPU). The processor 11 controls an overall operation of the memory controller 3. For example, when the processor 11 receives a write command from the host device 4, the processor 11 issues a write command to the NAND type flash memory 2 based on the NAND interface protocol in response to the write command. The same applies to processes of reading and erasing the data. In addition, the processor 11 performs various types of processing such as wear leveling for managing the NAND type flash memory 2.

The RAM 12 is used as a workspace of the processor 11 and stores firmware loaded from the NAND type flash memory 2, various types of tables created by the processor 11, and the like. The RAM 12 is configured as a DRAM and/or an SRAM. The buffer memory 13 temporarily retains the data transmitted from the host device 4, and also temporarily retains the data transmitted from the NAND type flash memory 2. The buffer memory 13 may be provided in the RAM 12.

At the time of the write operation, the ECC circuit 15 creates an error correcting code with respect to the write data and transmits the error correcting code, along with the write data, to a NAND interface circuit 14. In addition, at the time of the read operation, the ECC circuit 15 performs error detection and/or error correction on the read data by using the error correcting code included in the read data. The ECC circuit 15 may be provided in the NAND interface circuit 14.

The NAND interface circuit 14 is connected to the NAND type flash memory 2 through a NAND bus and performs interface processing between the NAND type flash memory 2 and the NAND interface circuit 14. In addition, the NAND interface circuit 14 transmits and receives commands, addresses, and data between the NAND type flash memory 2 and the NAND interface circuit 14.

[1-1-1] Configuration of NAND Type Flash Memory 2

Figure 2:
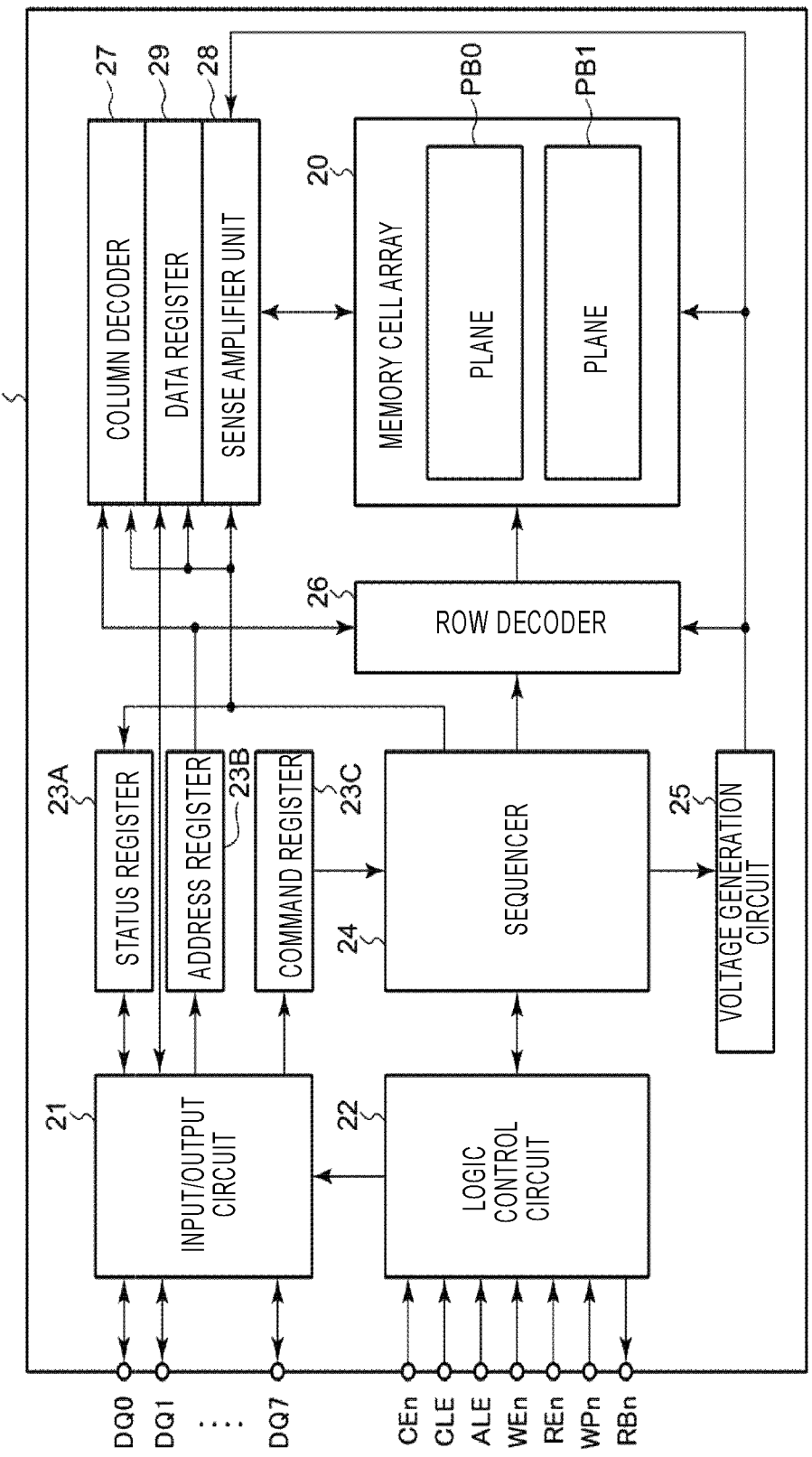
FIG. 2 is a block diagram of a NAND type flash memory.

FIG. 2 is a block diagram of the NAND type flash memory 2 illustrated in FIG. 1.

The NAND type flash memory 2 has a memory cell array 20, an input-output circuit 21, a logic control circuit 22, a register group, including a status register 23A, an address register 23B, and a command register 23C, a sequencer 24 (also referred to as a control circuit 24 in some instances), a voltage generating circuit 25, a row decoder 26, a column decoder 27, a sense amplifier unit 28, and a data register 29 (also referred to as a data cache 29).

The memory cell array 20 has a plurality of planes PB. FIG. 2 illustrates two planes PB0 and PB1 as an example. Each of the plurality of planes PB has a plurality of memory cell transistors. A plurality of bit lines, a plurality of word lines, a source line, and the like are disposed in the memory cell array 20 to apply voltages to the memory cell transistors. A specific configuration of the plane PB will be described below.

The input-output circuit 21 and the logic control circuit 22 are connected to the memory controller 3 through the NAND bus. The input-output circuit 21 transmits and receives signals DQ (e.g., DQ0 to DQ7) through the NAND bus between the memory controller 3 and the input-output circuit 21.

The logic control circuit 22 receives external control signals (e.g., a chip enable signal CEn, a command latch enable signal CLE, an address latch enable signal ALE, a write enable signal WEn, a read enable signal REn, and a write protection signal WPn) from the memory controller 3 through the NAND bus. "n" added to the signal names indicates active-low. In addition, the logic control circuit 22 transmits a ready/busy signal RBn to the memory controller 3 through the NAND bus.

The signal CEn enables the NAND type flash memory 2 to be selected, and the signal CEn is asserted when the corresponding NAND type flash memory 2 is selected. The signal CLE enables a command, which is transmitted as the signal DQ, to be latched on the command register. The signal ALE enables an address, which is transmitted as the signal DQ, to be latched on the address register. The signal WEn enables the writing. The signal REn enables the reading. The signal WPn is asserted when the writing and the erasing are prohibited. The signal RBn indicates whether the NAND type flash memory 2 is in a ready state (a state in which the NAND type flash memory 2 can receive a command from the outside) or in a busy state (a state in which the NAND type flash memory 2 cannot receive a command from the outside). The memory controller 3 may recognize the state of the NAND type flash memory 2 by receiving the signal RBn from the NAND type flash memory 2.

The status register 23A temporarily retains the data required to operate the NAND type flash memory 2. The address register 23B temporarily retains the address. The command register 23C temporarily retains the command. The status register 23A, the address register 23B, and the command register 23C are implemented, for example, as RAMs.

The sequencer 24 receives a command from the command register 23C and controls the NAND type flash memory 2 in accordance with a sequence based on the command.

The voltage generating circuit 25 receives a power source voltage from the outside of the NAND type flash memory 2 and creates a plurality of voltages required for the write operation, the read operation, and the erasing operation by using the power source voltage. The voltage generating circuit 25 supplies the created voltages to the memory cell array 20, the row decoder 26, the sense amplifier unit 28, and the like.

The row decoder 26 receives a row address from the address register 23B and decodes the row address. The row decoder 26 performs an operation of selecting the word lines or the like based on the decoded row address. Further, the row decoder 26 transmits the plurality of voltages, which are required for the write operation, the read operation, and the erasing operation, to the memory cell array 20.

The column decoder 27 receives a column address from the address register 23B and decodes the column address. The column decoder 27 performs an operation of selecting the bit lines based on the decoded column address.

At the time of the read operation, the sense amplifier unit 28 detects and amplifies data read to the bit line from the memory cell transistor. In addition, at the time of the write operation, the sense amplifier unit 28 transmits the write data to the bit line.

At the time of the read operation, the data register 29 temporarily retains the data transmitted from the sense amplifier unit 28 and serially transmits the data to the input-output circuit 21. In addition, during the write operation, the data register 29 temporarily retains the data that is serially transmitted from the input-output circuit 21 and then the retained data is transmitted in parallel to the sense amplifier unit 28. The data register 29 is an SRAM or the like.

A power source voltage VCC and a ground voltage VSS are applied to the NAND type flash memory 2 through corresponding terminals.

[1-1-2] Configuration of Plane PB

Figure 3:
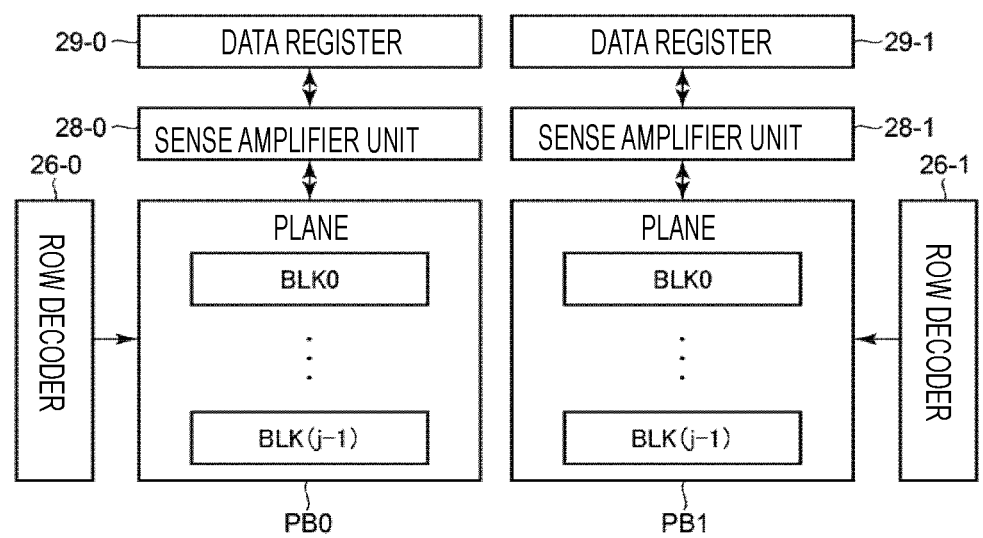
FIG. 3 is a block diagram of a plane PB illustrated in FIG. 2.

FIG. 3 is a block diagram of planes PB0 and PB1 illustrated in FIG. 2.

Each of the planes PB0 and PB1 has j blocks BLK0 to BLK(j−1), where j is an integer equal to or greater than 1.

The number of blocks BLK of the plane PB0 and the number of blocks BLK of the plane PB1 may be different from each other.

Each of the plurality of blocks BLK has a plurality of memory cell transistors. The memory cell transistors comprise an electrically rewritable memory cell. A specific configuration of the block BLK will be described below.

The row decoder 26, the sense amplifier unit 28, and the data register 29 are provided for each of the planes PB. That is, a row decoder 26-0 and a sense amplifier unit 28-0 are connected to the plane PB0. A data register 29-0 is connected to the sense amplifier unit 28-0. A row decoder 26-1 and a sense amplifier unit 28-1 are connected to the plane PB1. A data register 29-1 is connected to the sense amplifier unit 28-1.

[1-1-3] Configuration of Block BLK

Figure 4:
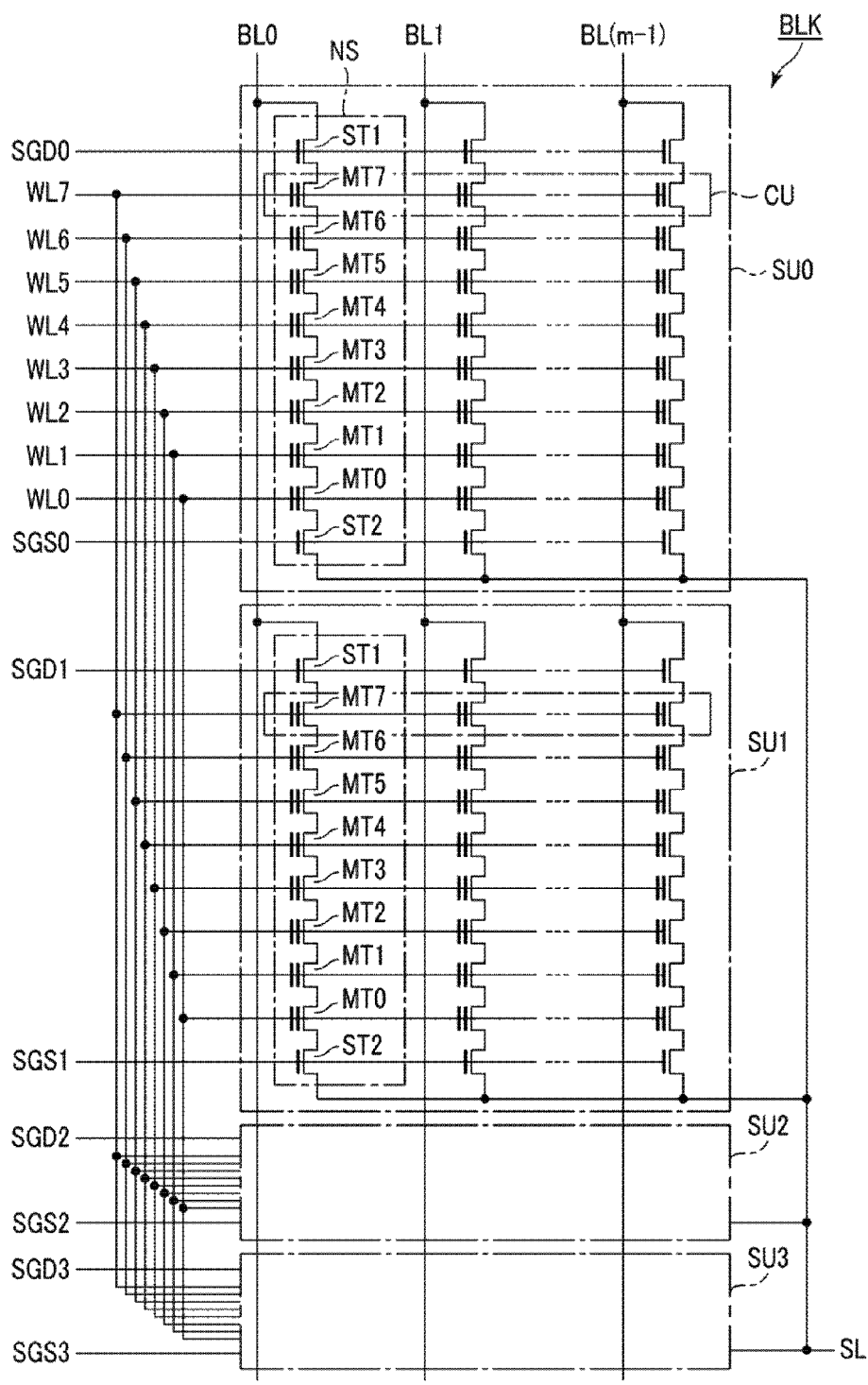
FIG. 4 is a circuit diagram of one block BLK in the plane PB.

FIG. 4 is a circuit diagram of one block BLK in the plane PB. Each of the plurality of blocks BLK has a plurality of string units SU. FIG. 4 illustrates four string units SU0 to SU3. The number of string units SU provided in the single block BLK may be arbitrarily set.

Each of the plurality of string units SU has a plurality of NAND strings NS (also referred to as memory strings). The number of NAND strings NS provided in the single string unit SU may be arbitrarily set.

Each of the NAND strings NS has a plurality of memory cell transistors MT and two select transistors ST1 and ST2. The memory cell transistors MT are connected in series between a source of the select transistor ST1 and a drain of the select transistor ST2. In the present specification, a memory cell transistor is also referred to as a memory cell or sometimes simply a cell. For the purpose of simplification, FIG. 4 illustrates a configuration example in which the NAND string NS has eight memory cell transistors MT (MT0 to MT7), but the actual number of memory cell transistors MT of the NAND string NS may be larger than eight and may be arbitrarily selected. A memory cell transistor MT has a control gate electrode and a charge storage layer and stores data in a non-volatile manner. The memory cell transistors MT may store 1-bit data or 2-bit data or more-bit data.

Gates of the select transistors ST1 in the string unit SU0 are connected in common to a select gate line SGD0, and similarly, select gate lines SGD1 to SGD3 are connected to the string units SU1 to SU3, respectively. Gates of select transistors ST2 in the string unit SU0 are connected in common to a select gate line SGS0, and similarly, select gate lines SGS1 to SGS3 are connected to the string units SU1 to SU3, respectively. A common select gate line SGS may be connected to the string units SU0 to SU3 in each of the blocks BLK. Control gates of the memory cell transistors MT0 to MT7 in each of the blocks BLK are connected to word lines WL0 to WL7, respectively.

Among the NAND strings NS arranged in a matrix configuration in each of the blocks BLK, drains of the select transistors ST1 of the plurality of NAND strings NS, which are in the same column, are connected in common to one of the bit lines BL0 to BL(m−1). In this context, "m" is an integer equal to or greater than 1. The bit lines BL are connected in common for the plurality of blocks BLK and are connected to one NAND string NS in each of the string units SU in each of the blocks BLK. Sources of the select transistors ST2 in each of the blocks BLK are connected in common to a source line SL. For example, the source line SL is connected in common to a plurality of the blocks BLK.

Data of the memory cell transistors MT are erased as a group by block, for example. Reading and the writing are performed on memory cell transistors MT by cell units, which are a connected in common to one word line WL in one string unit SU. A set of memory cell transistors MT, which shares a word line WL in the single string unit SU, is referred to as a cell unit CU. A group of 1-bit data stored the memory cell transistors MT provided in the cell unit CU is referred to as a page. That is, a write operation and a read operation to be performed on a cell unit CU are performed for each page in the cell unit.

The NAND string NS may include a dummy cell transistor or transistors. Specifically, for example, two dummy cell transistors (not specifically illustrated) are connected in series between the select transistor ST2 and the memory cell transistor MT0. Likewise, two dummy cell transistors are connected in series between the memory cell transistor MT7 and the select transistor ST1. A dummy word lines are connected to gates of dummy cell transistors. Each dummy cell transistor has the same structure as an active (non-dummy) memory cell transistor. The dummy cell transistors serve to mitigate disturbance applied to the memory cell transistor or the select transistor during the write operation or the erasing operation, rather than to store data.

[1-1-4] Stack Structure of Block BLK

Figure 5:
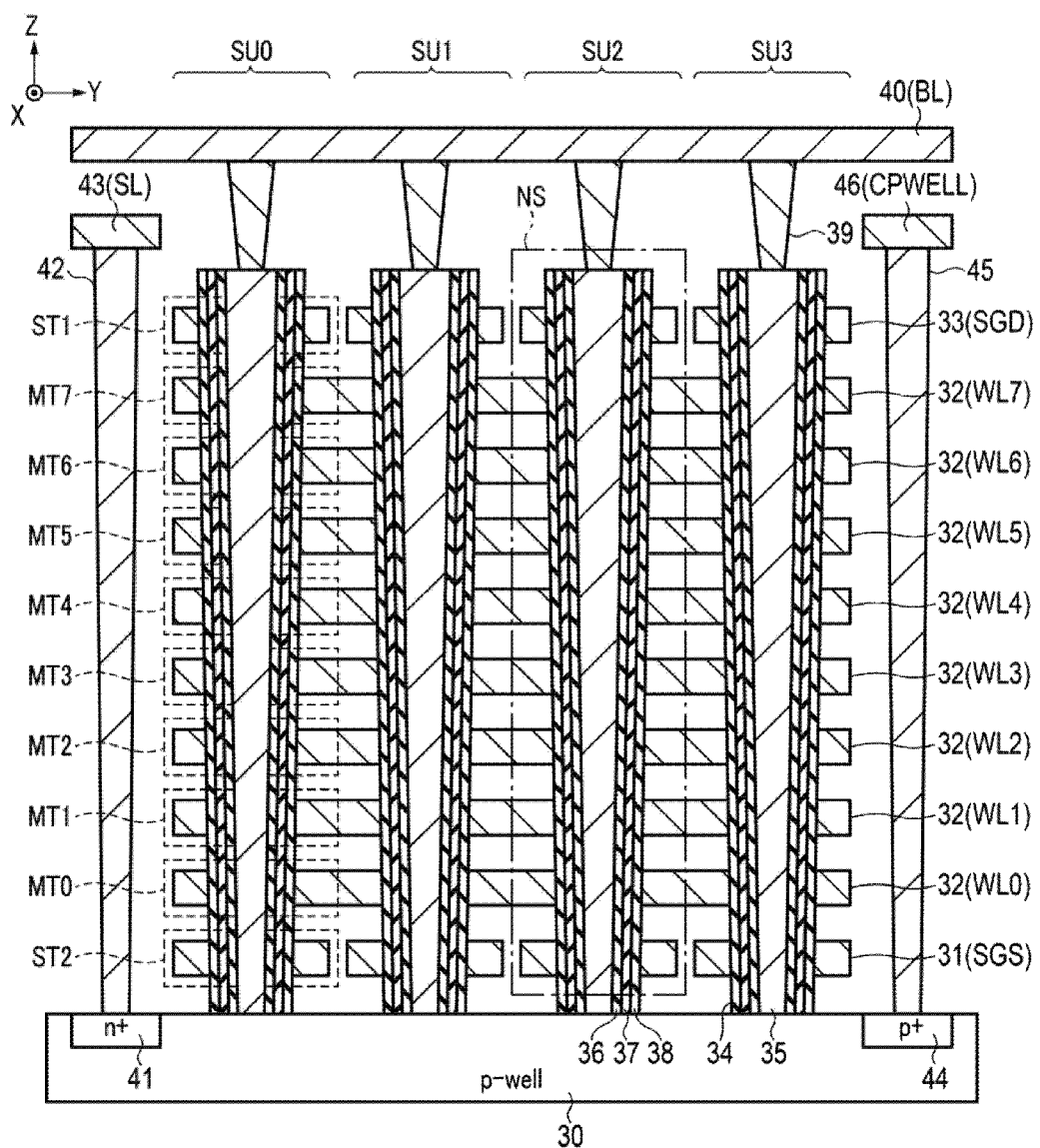
FIG. 5 is a cross-sectional view of a portion of the block BLK.

FIG. 5 is a cross-sectional view of a partial region of the block BLK. In FIG. 5, an X direction is a direction in which the select gate line extends. The Y direction, which is orthogonal to the X direction in a horizontal plane, is a direction in which the bit line extends, and a Z direction is a stack direction.

A p-type well region (p-well) 30 is provided in a semiconductor layer. The plurality of NAND strings NS are provided on the p-type well region 30. That is, on the well region 30, a wiring layer 31, which functions as the select gate line SGS, eight wiring layers 32, which function as the word lines WL0 to WL7, and a wiring layer 33, which functions as the select gate line SGD, are stacked in this order with insulating layers disposed therebetween. To avoid complicating the drawings, hatching in the plurality of insulating layers between the stacked wiring layers is omitted.

Memory holes 34 reach the well region 30 by penetrating the wiring layers 31, 32, and 33. A pillar-shaped semiconductor layer 35 (also referred to as semiconductor pillars 35) is provided in each of the memory holes 34. A gate insulating film 36, a charge storage layer (insulating film) 37, and a block insulating film 38 are sequentially provided on an outer peripheral surface of the semiconductor pillar 35. With these components, the memory cell transistors MT and the select transistors ST1 and ST2 are configured. The semiconductor pillar 35 is a region which serves as a current path of the NAND string NS and in which channels of the respective transistors are formed. Upper ends of the semiconductor pillars 35 are connected, through contact plugs 39, to a metal wiring layer 40 that serves as the bit line BL.

An n+ type diffusion region 41 doped with n-type impurities with high concentration is provided in a surface region of the well region 30. A contact plug 42 is provided on the diffusion region 41, and the contact plug 42 is connected to a metal wiring layer 43 that serves as the source line SL. Further, a p+ type diffusion region 44 doped with p-type impurities with high concentration is provided in the surface region of the well region 30. A contact plug 45 is provided on the diffusion region 44, and the contact plug 45 is connected to a metal wiring layer 46 that serves as a well wire CPWELL. The well wire CPWELL is a wire for applying a voltage to the semiconductor pillar 35 through the well region 30.

The above-described configurations are repeated in the depth direction (X direction) into the page surface of FIG. 5 and the string unit SU are configured with a cluster of the plurality of NAND strings NS arranged in the X direction.

[1-1-5] Distribution of Threshold Values of Memory Cell Transistors

Figure 6:
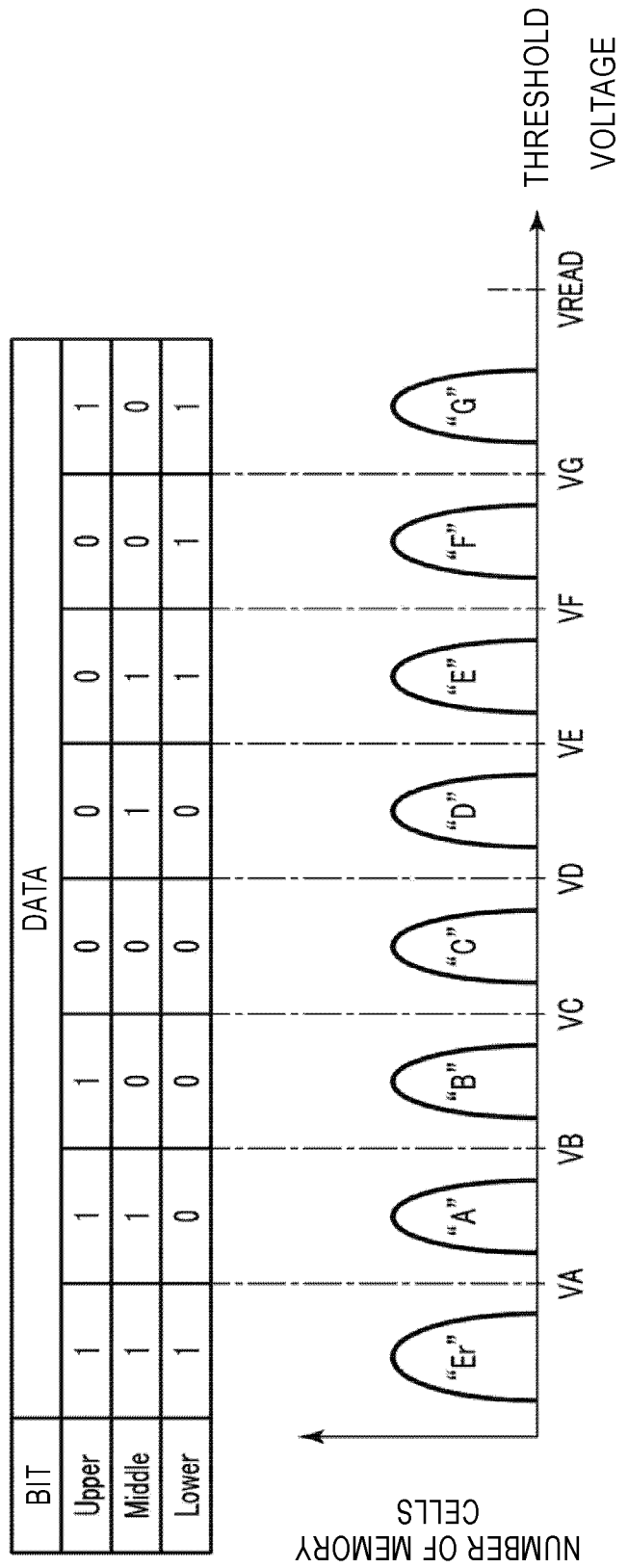
FIG. 6 is a schematic view illustrating an example of a distribution of threshold values of memory cell transistors.

Next, a distribution of threshold voltages Vth taken by the memory cell transistors MT will be described. FIG. 6 is a schematic view illustrating an example of a distribution of threshold values of the memory cell transistors MT. The memory cell transistor MT may store 2 or more bits of data. In the present embodiment, a case in which the memory cell transistor MT stores 3 bits of data, that is, a so-called triple level cell (TLC) manner will be described as an example.

The 3 bits of data are defined by a low-order (lower) bit, a middle-order (middle) bit, and a high-order (upper) bit. In the case in which the memory cell transistor MT stores 3 bits, the memory cell transistor MT can have any one of eight threshold voltages. The eight threshold voltages are referred to as States "Er", "A", "B", "C", D "E", "F", and "G" sequentially from a low threshold voltage. The memory cell transistors MT, which belong to each of the States "Er", "A", "B", "C", "D", "E", "F", and "G", define a distribution.

For example, Data values "111", "110", "100", "000", "010", "011", "001", and "101" are assigned to the states "Er", "A", "B", "C", "D", "E", "F", and "G", respectively. The arrangement of the bits is "X, Y, Z," assuming that the high-order bit is "X", the middle-order bit is "Y", and the low-order bit is "Z". The distribution of the threshold values and the assignment of the data may be arbitrarily designed and various coding schemes are known.

The distribution group or state to which the threshold voltage of a memory cell transistor MT belongs is determined to read the data stored in the memory cell transistor MT. Read voltages VA, VB, VC, VD, VE, VF, and VG are used to determine the particular "State" of the memory cell transistor MT.

For example, the State "Er" corresponds to an erased state. The threshold voltage of a memory cell transistor MT, which belongs to the State "Er", may be lower than the voltage VA and has a negative value, for example.

The States "A" to "G" correspond to states in which electric charges have been injected into the charge storage layer and data has been written on the memory cell transistors MT, and the threshold voltages of the memory cell transistors MT, which belong to the State "A" to "G", have positive values, for example. The threshold voltage of the memory cell transistor MT which belongs to the State "A", is higher than the read voltage VA and equal to or lower than the read voltage VB. The threshold voltage of the memory cell transistor MT which belongs to the State "B", is higher than the read voltage VB and equal to or lower than the read voltage VC. The threshold voltage of the memory cell transistor MT which belongs to the State "C", is higher than the read voltage VC and equal to or lower than the read voltage VD. The threshold voltage of the memory cell transistor MT which belongs to the State "D", is higher than the read voltage VD and equal to or lower than the read voltage VE. The threshold voltage of the memory cell transistor MT which belongs to the State "E", is higher than the read voltage VE and equal to or lower than the read voltage VF. The threshold voltage of the memory cell transistor MT which belongs to the State "F", is higher than the read voltage VF and equal to or lower than the read voltage VG. The threshold voltage of the memory cell transistor MT which belongs to the State "G", is higher than the read voltage VG and lower than a voltage VREAD.

The voltage VREAD is a voltage which is applied to a word line WL connected to the memory cell transistor MT of the cell unit CU that is not a target to be read, and is higher than the threshold voltage of the memory cell transistor MT in any data state. That is, the memory cell transistor MT having a control gate electrode to which the voltage VREAD is applied is in an On state regardless of retained data.

As described above, each of the memory cell transistors MT can be set to any one of the eight states and may thus store 3 bits of data. In addition, the writing and the reading are performed for each page in the single cell unit CU. In the case in which the memory cell transistor MT stores 3 bits of data, the low-order bit, the middle-order bit, and the high-order bit are assigned to each of the three pages in the single cell unit CU. The pages are called a low-order (lower) page, a middle-order (middle) page, and a high-order (upper) page and the pages are written respectively as a group by order.

[1-1-6] Configurations of Sense Amplifier Unit 28 and Data Register 29

Figure 7:
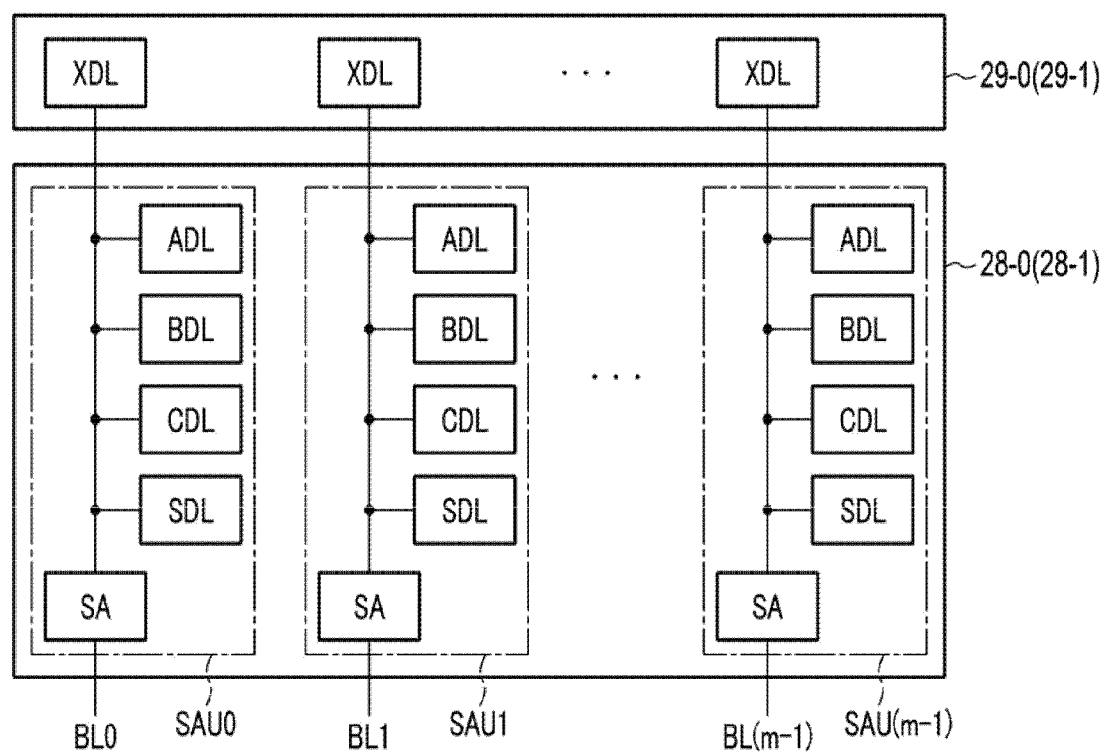
FIG. 7 is a block diagram of a sense amplifier unit and a data register.

FIG. 7 is a block diagram of the sense amplifier units 28-0 and 28-1 and the data registers 29-0 and 29-1 which are illustrated in FIG. 3. FIG. 7 illustrates a sense amplifier unit 28-0, but the sense amplifier units 28-0 and 28-1 have the same configuration. Similarly, FIG. 7 illustrates a data register 29-0, but the data registers 29-0 and 29-1 have the same configuration.

The sense amplifier unit 28-0 has sense amplifier units SAU0 to SAU (m−1) that correspond to the bit lines BL0 to BL (m−1). Each of the sense amplifier units SAU has a sense amplifier SA and data latch circuits SDL, ADL, BDL, and CDL. In each of the sense amplifier units SAU, the sense amplifier SA and the data latch circuits SDL, ADL, BDL, and CDL are connected so as to be able to transmit data to one another.

The data latch circuits SDL, ADL, BDL, and CDL temporarily retain data. At the time of the write operation, the sense amplifier SA controls a voltage of the bit line BL in accordance with the data retained by the data latch circuit SDL. The data latch circuits ADL, BDL, and CDL are used for the plurality of values for which the memory cell transistor MT retain 2 or more bits of data. Here, the data latch circuit ADL is used to retain the low-order page. The data latch circuit BDL is used to retain the middle-order page. The data latch circuit CDL is used to retain the high-order page. The number of data latch circuits provided in the sense amplifier unit SAU may be arbitrarily changed in accordance with the number of bits retained by a single memory cell transistor MT.

At the time of the read operation, the sense amplifier SA detects the data read to the corresponding bit line BL and determines whether the read data is Data "0" or Data "1". In addition, at the time of the write operation, the sense amplifier SA applies a voltage to the bit line BL based on the write data.

The data register 29-0 has data latch circuits XDL in a number corresponding to the number of sense amplifier units SAU0 to SAU(m−1). The data latch circuits XDL are connected to the input-output circuit 21. The data latch circuits XDL temporarily retain the write data transmitted from the input-output circuit 21 and temporarily retain the read data transmitted from the sense amplifier unit SAU. More specifically, the data transmission between the input-output circuit 21 and the sense amplifier unit 28-0 are performed through the data latch circuits XDL for one page. The write data, which are received by the input-output circuit 21, are transmitted to one of the data latch circuits ADL, BDL, and CDL through the data latch circuit XDL.

The read data, which is read by the sense amplifier SA, are transmitted to the input-output circuit 21 through the data latch circuit XDL.

(VHSASLOW Setting Circuit)

Figure 8:
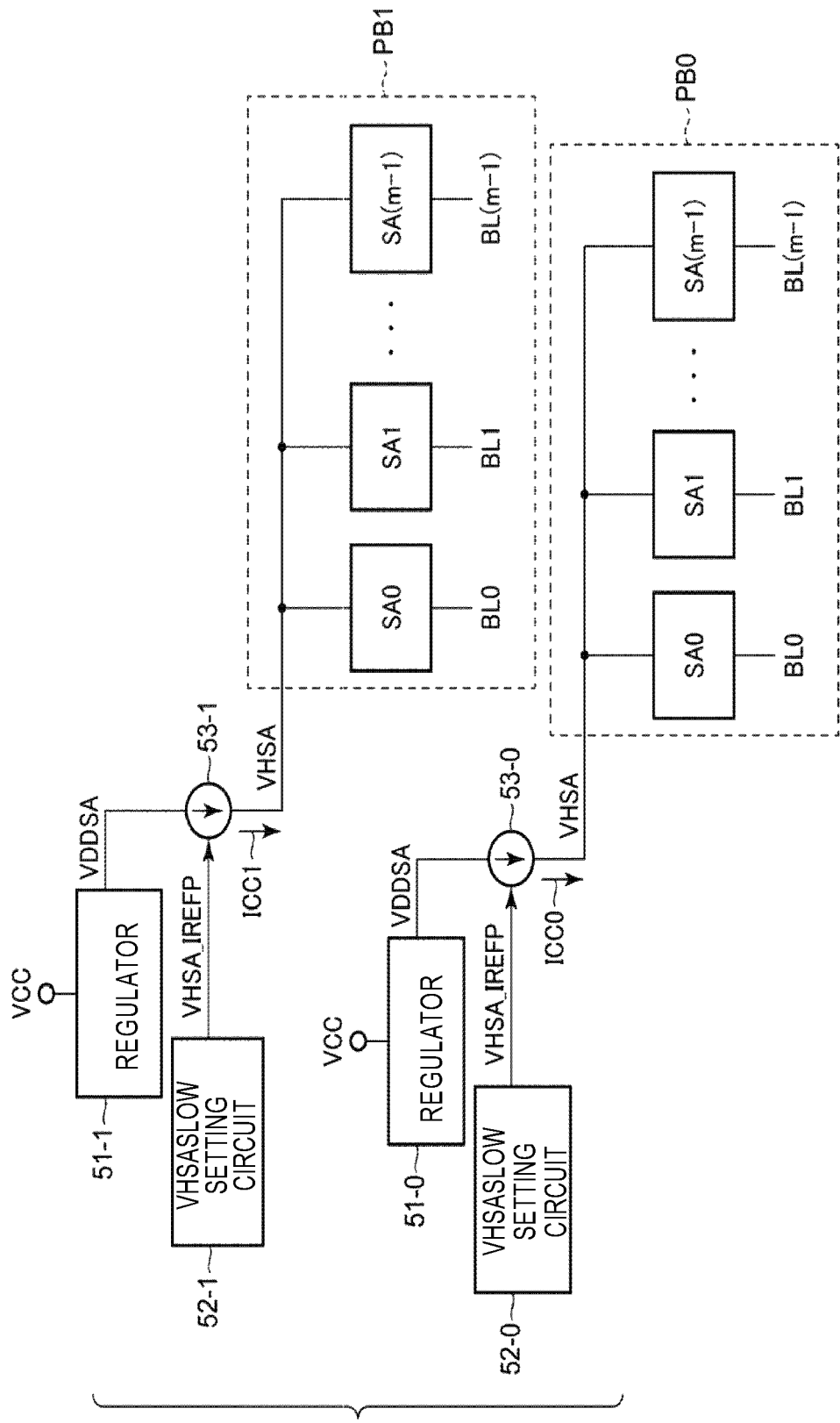
FIG. 8 is a circuit diagram depicting aspects of a power source circuit of a sense amplifier.

FIG. 8 is a circuit diagram for explaining a power source circuit of the sense amplifier SA.

The sense amplifier unit 28-0 further includes a regulator 51-0, a variable current source 53-0, and a VHSASLOW setting circuit 52-0. Similarly, the sense amplifier unit 28-1 further includes a regulator 51-1, a variable current source 53-1, and a VHSASLOW setting circuit 52-1. The sequencer 24 controls operations of the regulators 51-0 and 51-1 and operations of the VHSASLOW setting circuits 52-0 and 52-1.

The regulator 51-0 is connected to a power source terminal to which the power source voltage VCC is supplied. The regulator 51-0 creates a voltage VDDSA by using the power source voltage VCC.

The variable current source 53-0 is connected to a VHSA terminal of the sense amplifier SA and a power source terminal to which the voltage VDDSA is supplied. The variable current source 53-0 supplies a current to the sense amplifiers SA0 to SA(m−1) in the corresponding plane PB0 and sets a voltage of the VHSA terminal to the voltage VDDSA. The sense amplifiers SA0 to SA(m−1) are operated by using the voltage applied to the VHSA terminal.

The VHSASLOW setting circuit 52-0 creates a signal VHSA_IREFP having a variable DAC (digital-analog conversion) value. The signal VHSA_IREFP is supplied to the variable current source 53-0. The variable current source 53-0 supplies a predetermined current to the VHSA terminal based on the signal VHSA_IREFP. The VHSASLOW setting circuit 52-0 serves to restrict the current consumption ICC0 of the current flowing to the corresponding plane PB0.

The configurations of the regulator 51-1, the variable current source 53-1, and the VHSASLOW setting circuit 52-1 are identical to the configurations of the regulator 51-0, the variable current source 53-0, and the VHSASLOW setting circuit 52-0.

[1-2] Operation

An operation of the memory system 1 configured as described above will be described.

[1-2-1] Program Operation

Figure 9:
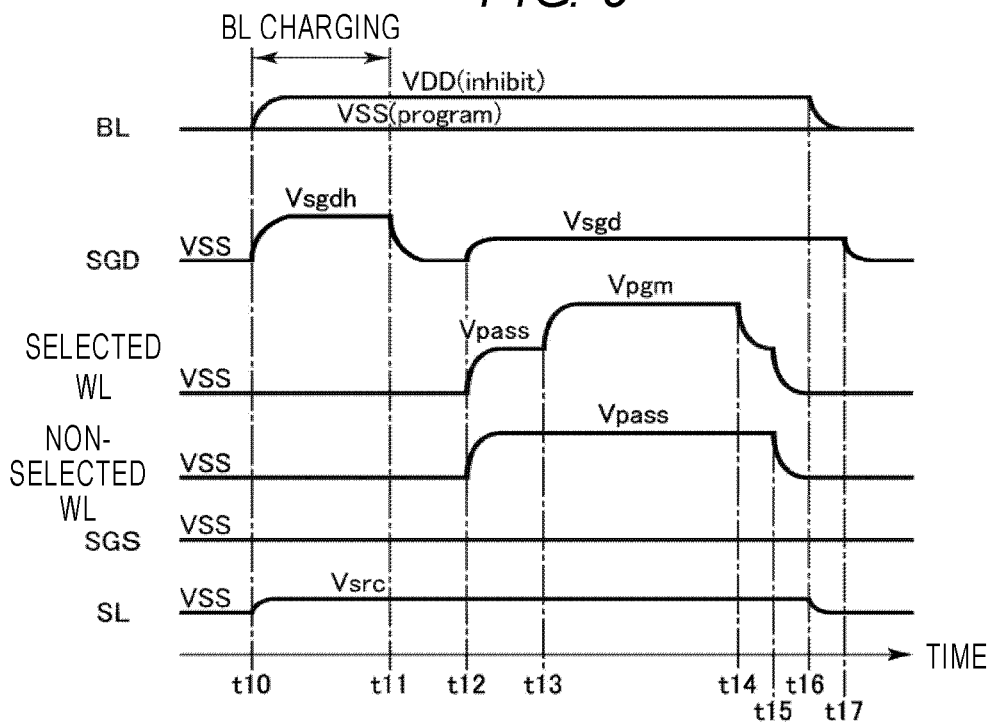
FIG. 9 is a timing chart depicting aspects of a program operation.

FIG. 9 is a timing chart for explaining the program operation.

At a point of time t10, the charging of the bit line BL is started. That is, the sense amplifier unit 28 applies the ground voltage VSS(=0 V) to the selected bit line BL and applies a voltage for prohibiting writing (e.g., a power source voltage VDD) to the non-selected bit line BL. The row decoder 26 applies a voltage Vsgdh to the select gate line SGD and applies the ground voltage VSS to the select gate line SGS. The voltage Vsgdh is a voltage for turning on the select transistor ST1. A voltage Vsrc is applied to the source line SL. The voltage Vsrc satisfies the relationship VSS≤Vsrc<VDD. Therefore, the select transistor ST1 is turned on, and the select transistor ST2 is turned off. As a result, in the NAND string connected to the non-selected bit line BL, the power source voltage VDD is transmitted to the channel. Meanwhile, in the NAND string connected to the selected bit line BL, the ground voltage VSS is transmitted to the channel.

At a point of time t11, the row decoder 26 applies the ground voltage VSS to the select gate line SGD. Therefore, the select transistor ST1 is turned off.

At a point of time t12, the row decoder 26 applies a voltage Vsgd to the select gate line SGD and applies a voltage Vpass to all of the word lines WL. The voltage Vsgd is a voltage which is lower than the voltage Vsgdh, turns on the select transistor ST1 connected to the selected bit line BL (which is a bit line to which the ground voltage VSS is applied), but cuts off the select transistor ST1 connected to the non-selected bit lines BL (a bit line BL to which the power source voltage VDD is applied). The voltage Vpass is a voltage that turns on the memory cell transistor MT regardless of the threshold voltage (data state) of the memory cell transistor MT.

At a point of time t13, the row decoder 26 applies a program voltage Vpgm to the selected word line WL. The program voltage Vpgm is a voltage higher than the voltage Vpass. Therefore, in the selected NAND string, a potential difference between the selected word line WL and the channel is increased, and electrons are injected into the charge storage layer of the selected memory cell transistor MT. Meanwhile, in the non-selected NAND string, the potential difference between the selected word line WL and the channel is not increased, and the threshold voltage of the memory cell transistor MT is maintained.

At a point of time t14, the ground voltage VSS is applied to the selected word line WL. At a point of time t15, the ground voltage VSS is applied to the non-selected word line WL. At a point of time t16, the ground voltage VSS is applied to the non-selected bit line BL and the source line SL. At a point of time t17, the ground voltage VSS is applied to the select gate line SGD.

[1-2-2] Charging Operation of Bit Line

The charging operation of a bit line corresponds to the operations from time t10 to t11 in FIG. 9.

A maximum current Imax' of a NAND type flash memory 2 is defined based on its manufacturing specifications. The maximum current Imax' of the specifications can be considered a maximum value of current consumption that may be applied to the chip in normal, non-damaging operation. In the present embodiment, a designed maximum current Imax is used. The designed maximum current Imax may be a measured value for the chip. The NAND type flash memory 2 operates so that the current consumption thereof does not exceed the designed maximum current Imax. For example, the designed maximum current Imax is set to have an additional margin from the maximum current Imax' of the specifications. Alternatively, the designed maximum current Imax may be set to be equal to the maximum current Imax' of the specification. That is, there is a relationship of the designed maximum current Imax the maximum current Imax' of the specifications. Hereinafter, the designed maximum current Imax is also simply referred to as a maximum current Imax.

Figure 10:
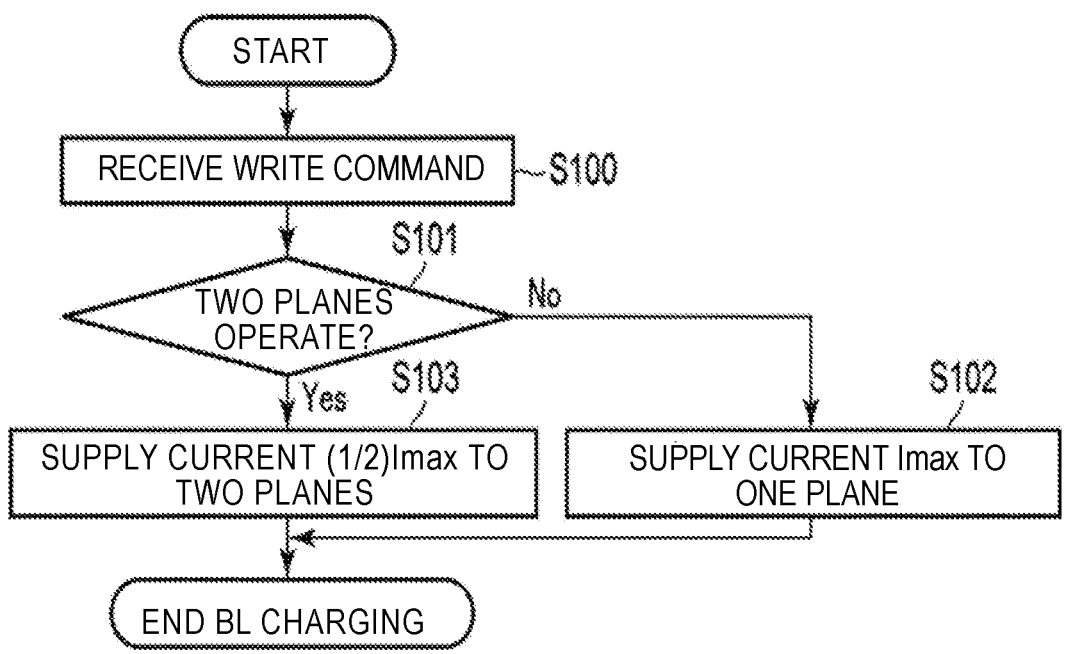
FIG. 10 is a flowchart for a charging operation of a bit line according to a first embodiment.

FIG. 10 is a flowchart for explaining the charging operation of the bit line according to the first embodiment.

The sequencer 24 receives the write command (including write commands, addresses, and write data) from the memory controller 3 (step S100). Based on the write command, the sequencer 24 determines whether a 2-plane operation is performed (step S101). A 1-plane operation refers to a mode in which only one of the planes PB0 and PB1 are programmed in a program operation). The 2-plane operation refers to a mode in which both the planes PB0 and PB1 a programmed in a program operation in parallel with each other. For example, the case in which the addresses of the planes PB0 and PB1 are designated in accordance with the write command transmitted from the memory controller 3 corresponds to the 2-plane operation.

In the case of the 1-plane operation (step S101=No), the sequencer 24 performs the control to supply the maximum current Imax to the corresponding plane PB0 or PB1 (step S102). For example, in the case of the 1-plane operation in which only the plane PB0 operates, the sequencer 24 controls the VHSASLOW setting circuit 52-0 to limit the maximum value of the current supplied from the variable current source 53-0 to the sense amplifiers SA0 to SA(m−1) in the plane PB0 so that the maximum value becomes the current Imax.

Meanwhile, in the case of the 2-plane operation (step S101=Yes), the sequencer 24 performs the control to supply the current (½)Imax to each of the two planes PB0 and PB1 (step S103). For example, the sequencer 24 controls the VHSASLOW setting circuit 52-0 to limit the maximum value of the current supplied to the sense amplifiers SA0 to SA(m−1) in the plane PB0 from the variable current source 53-0 so that the maximum value becomes the current (½)Imax, and the sequencer 24 controls the VHSASLOW setting circuit 52-1 to limit the maximum value of the current supplied to the sense amplifiers SA0 to SA(m−1) in the plane PB1 from the variable current source 53-1 so that the maximum value becomes the current (½)Imax.

Thereafter, the charging of the bit line of the plane PB ends.

Figure 11:
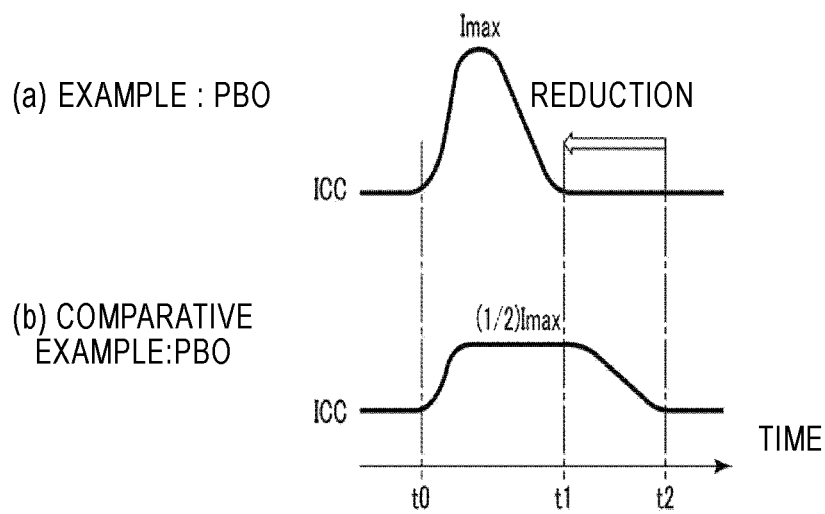
FIG. 11 is a timing chart for the charging operation of the bit line in a 1-plane operation.

FIG. 11 is a timing chart for explaining the charging operation of the bit line in the 1-plane operation. FIG. 11 illustrates waveforms of Example (a) and Comparative Example (b). For example, it is assumed here that the program operation is performed on the plane PB0, but not performed on the plane PB1.

At a point of time t0, the sequencer 24 starts the charging of the bit line BL in the plane PB0. In the case in which only the plane PB0 is written, the VHSASLOW setting circuit 52-0 controls the variable current source 53-0 so that the maximum current Imax may flow to the plane PB0. At a point of time t1, the charging of the bit line BL ends.

Meanwhile, in the Comparative Example (b) of FIG. 11, the maximum value of the current, which may flow in the planes PB0 and PB1, is limited to the current (½)Imax. In this Comparative Example, the current for the respective planes is calculated as "Maximum Current Imax/Number of Planes". This condition is effective in that the NAND type flash memory 2 chip as whole does not exceed the current Imax, but there is a margin in respect to the current consumption in the case in which only one plane (e.g., the plane PB0) operates. In the Comparative Example, the charging of the bit line BL ends at a point of time t2.

As described above, the Example (a) in FIG. 11 reduces the charging time in comparison with the Comparative Example (b). Furthermore, the Example (a) reduces the time required by the program operation.

Figure 12:
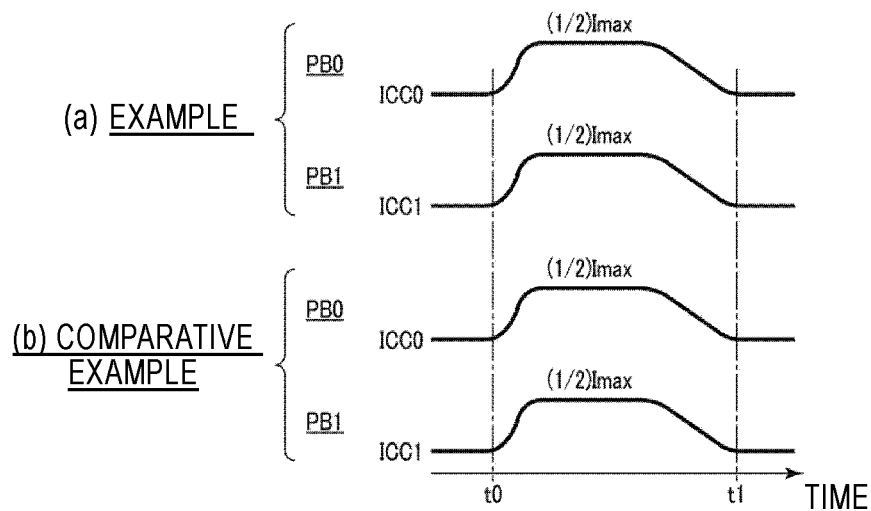
FIG. 12 is a timing chart for the charging operation of the bit line in a 2-plane operation.

FIG. 12 is a timing chart for explaining the charging operation of the bit line in the 2-plane operation. FIG. 12 illustrates waveforms of Example (a) and Comparative Example (b). In the 2-plane operation, the program operations are performed on the plane PB0 and the plane PB1 in parallel. The current consumption ICC0 of the plane PB0 and the current consumption ICC1 of the plane PB1 are indicated. A sum of the current consumption ICC0 and the current consumption ICC1 is current consumption ICC of the entire chip.

The VHSASLOW setting circuit 52-0 controls the variable current source 53-0 so that the current (½) Imax may flow to the plane PB0. The VHSASLOW setting circuit 52-1 controls the variable current source 53-1 so that the current (½)Imax flows to the plane PB1. Therefore, it is possible to prevent the current consumption ICC of the entire chip from exceeding the maximum current Imax in the 2-plane operation.

In the Comparative Example, the current, which may flow in advance to one plane, is set to the current (½)Imax. Therefore, in this instance the operation of the Comparative Example (b) of FIG. 12 is identical to the operation of the Example (a) of FIG. 12.

Figure 13:
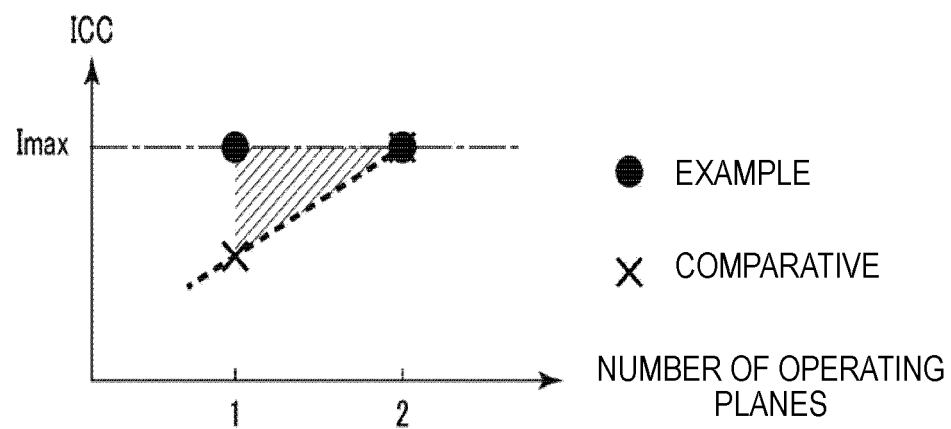
FIG. 13 is a graph for explaining aspects of current consumption of the entire NAND type flash memory.

FIG. 13 is a graph for explaining the current consumption ICC of the entire NAND type flash memory 2. FIG. 13 illustrates a case in which the NAND type flash memory 2 has two planes. A horizontal axis in FIG. 13 indicates the number of planes which are being operated (the number of written planes), and a vertical axis in FIG. 13 indicates the current consumption ICC of the entire chip in the programming operation.

In the 1-plane operation of the Example, the current, which is larger than the current in the Comparative Example, may all flow to one plane. Specifically, the current, which is larger than the current in the Comparative Example by the hatched portion in FIG. 13, may flow.

[1-3] Modified Example

Figure 14:
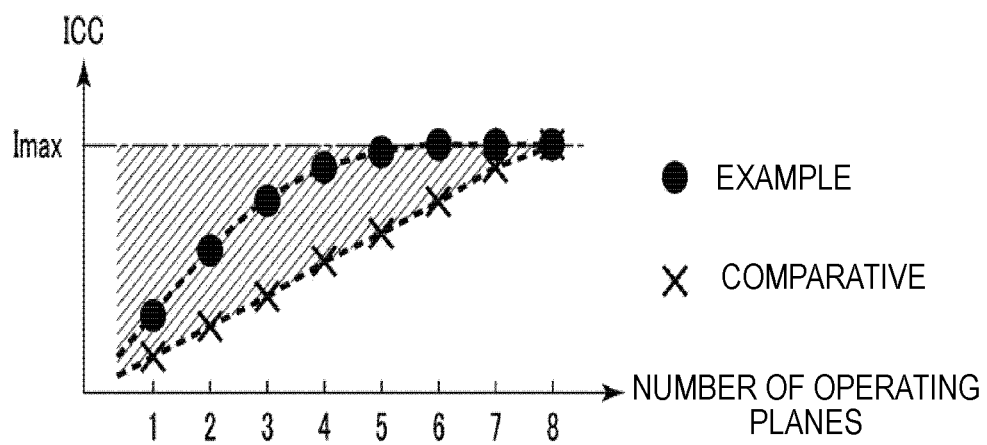
FIG. 14 is a graph of current consumption when the NAND type flash memory has 8 planes.

The NAND type flash memory 2 may have three or more planes PB. FIG. 14 is a graph for explaining the current consumption ICC in the case in which the NAND type flash memory 2 has eight planes (also referred to as an 8-plane product).

In the Comparative Example, a maximum value of the current which may flow to any one plane, is set to a current (⅛) Imax. However, in the Example a current which is larger than the current in the Comparative Example flows to one or more planes when less than all planes are being programmed at once even though any number of operating planes is set. In addition, the Example may allow the current which is larger than the current in the Comparative Example maximally by only the hatched portion in FIG. 14, to flow.

[1-4] Effect of First Embodiment

In the first embodiment, the NAND type flash memory 2 has the two planes PB0 and PB1, which may operate in parallel. In the case in which only the plane PB0 operates when the maximum current (the designed maximum value of the current that may flow to the chip) is set to the Imax, the sequencer 24 supplies the plane PB0 with the current larger than the current (½) Imax which is a current value obtained by simply dividing the maximum current Imax by the number of planes. In addition, in the case in which the planes PB0 and PB1 operate in parallel, the sequencer 24 supplies the current (½) Imax to the planes PB0 and PB1.

Therefore, according to the first embodiment, it is possible to achieve the semiconductor storage device capable of improving a performance. That is, for example, it is possible to reduce the time related to the program operation because it is possible to reduce the charging time of the bit line by increasing the charging current.

In the Comparative Example, the current is adjusted so that the current which may flow for each plane does not exceed the (½)Imax. In addition, the charging periods of the bit line are set to the same timing in respect to the two planes. For this reason, in the plane in which the charging ends quickly, there occurs standby time until the process goes to a next operation such that a performance deteriorates In contrast, in the present embodiment, the current, which may flow to each of the planes, may vary in the case in which only one plane operates and the case in which the two planes operate in parallel. Therefore, in the case in which only one plane operates, it is possible to reduce the standby time and improve the performance.

It is possible to perform the control so that the current consumption of the NAND type flash memory 2 does not exceed the maximum current Imax.

[2] Second Embodiment

In a second embodiment, the current which flows to each of the planes PB is set to the current Imax, and the BL charging operation of the plane PB0 and the BL charging operation of the plane PB1 are controlled so that the BL charging operation of the plane PB0 and the BL charging operation of the plane PB1 partially overlap each other.

Figure 15:
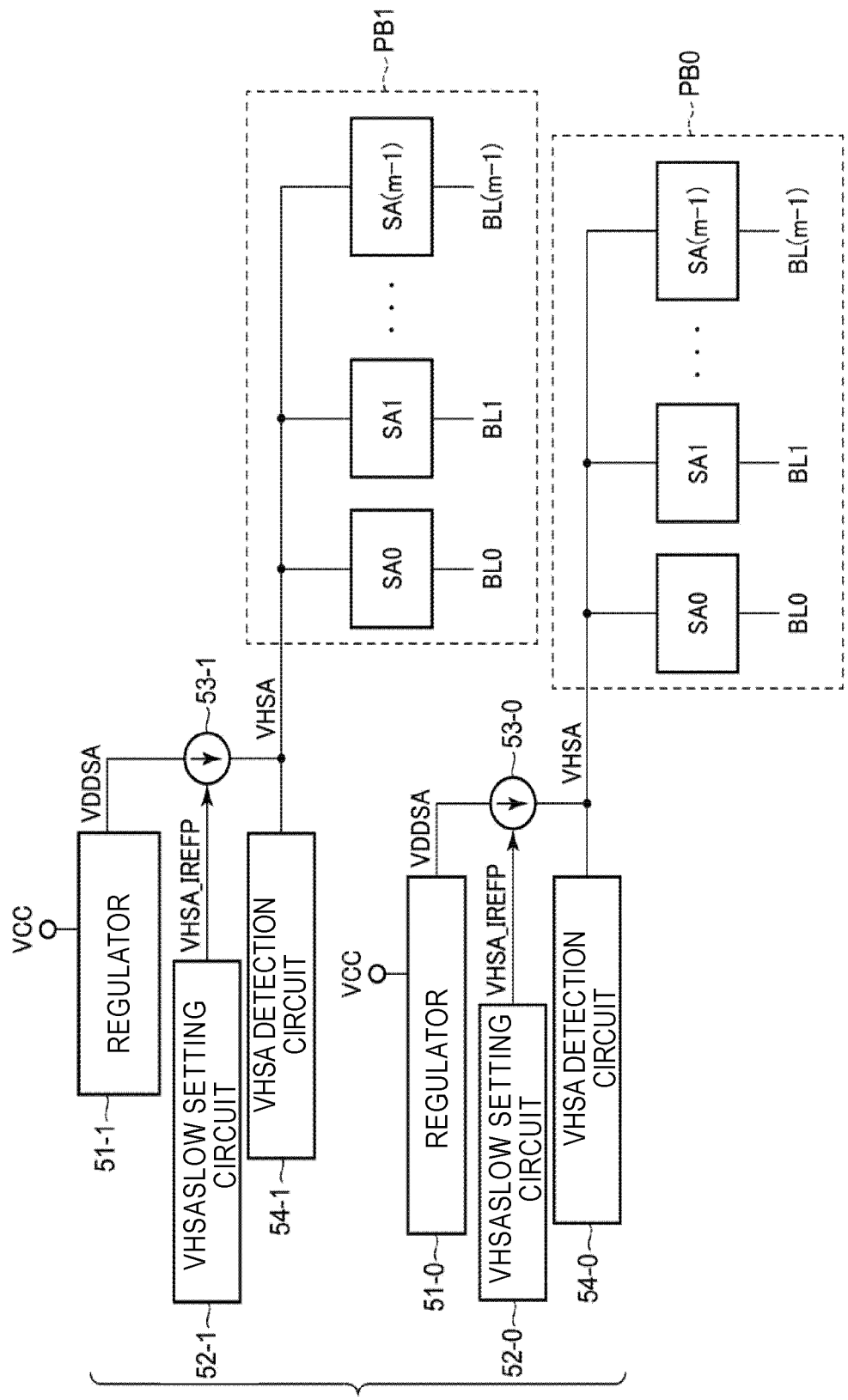
FIG. 15 is a circuit diagram depicting aspects of a power source circuit of a sense amplifier according to a second embodiment.

FIG. 15 is a circuit diagram for explaining a power source circuit of the sense amplifier SA according to the second embodiment. The sense amplifier units 28-0 and 28-1 further has VHSA detection circuits 54-0 and 54-1, respectively.

The VHSA detection circuit 54-0 detects a voltage level of the VHSA terminal. In addition, the VHSA detection circuit 54-0 determines whether the voltage VHSA returns to a level equal to or higher than a determined voltage Vdet. More specifically, the VHSA detection circuit 54-0 determines whether the voltage VHSA temporarily becomes lower than the determined voltage Vdet and then returns to a level equal to or higher than the determined voltage Vdet. The determination result of the VHSA detection circuit 54-0 is supplied to the sequencer 24. The determined voltage Vdet is a value which is empirically set based on the amount of drop of the voltage VHSA when the current Imax flows to each of the planes. The configuration of the VHSA detection circuit 54-1 is also identical to the configuration of the VHSA detection circuit 54-0.

Figure 16:
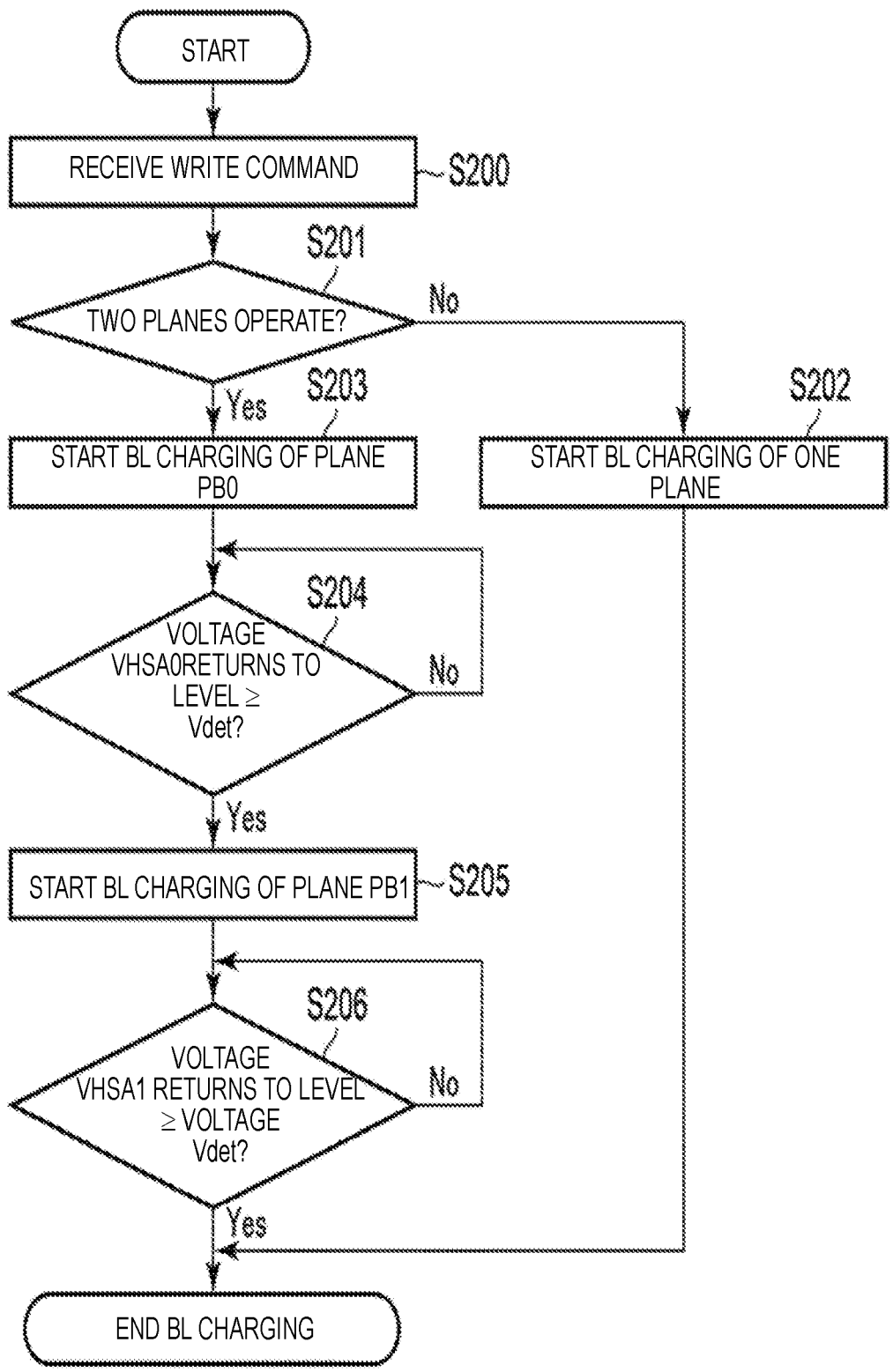
FIG. 16 is a flowchart for a charging operation of a bit line according to a second embodiment.

FIG. 16 is a flowchart for explaining the charging operation of the bit line according to the second embodiment.

The sequencer 24 receives the write command from the memory controller 3 (step S200). Based on the write command, the sequencer 24 determines whether the 2-plane operation is performed (step S201).

In the case of the 1-plane operation (step S201=No), the sequencer 24 starts the charging of the bit line BL in the corresponding plane PB (step S201). The 1-plane operation is identical to the 1-plane operation in the first embodiment. Thereafter, the charging of the bit line in the one plane ends.

In the case of the 2-plane operation (step S201=Yes), the sequencer 24 starts the charging of the bit line BL, for example in the plane PB0 (step S203).

Subsequently, the VHSA detection circuit 54-0 determines whether a voltage VHSA0 temporarily becomes lower than the voltage Vdet and then returns to a level equal to or higher than the voltage Vdet (step S204). In the case in which the voltage VHSA0 returns to the level equal to or higher than the voltage Vdet, the sequencer 24 determines that the charging of the bit line in the plane PB0 is approximately completed.

In the case in which the voltage VHSA0 returns to the level equal to or higher than the voltage Vdet, the sequencer 24 starts the charging of the bit line BL in the plane PB1 (step S205).

Subsequently, the VHSA detection circuit 54-1 determines whether after a voltage VHSA1 temporarily becomes lower than the voltage Vdet, it then returns to a level equal to or higher than the voltage Vdet (step S206). In the case in which the voltage VHSA1 returns to the level equal to or higher than the voltage Vdet, the sequencer 24 determines that the charging of the bit line in the plane PB1 is approximately completed. Thereafter, the charging of the bit line in the plane PB1 ends.

The two planes may be charged in the order of the plane PB1 and the plane PB0. In addition, the plane that is preferentially charged may be set by a set feature command.

Figure 17:
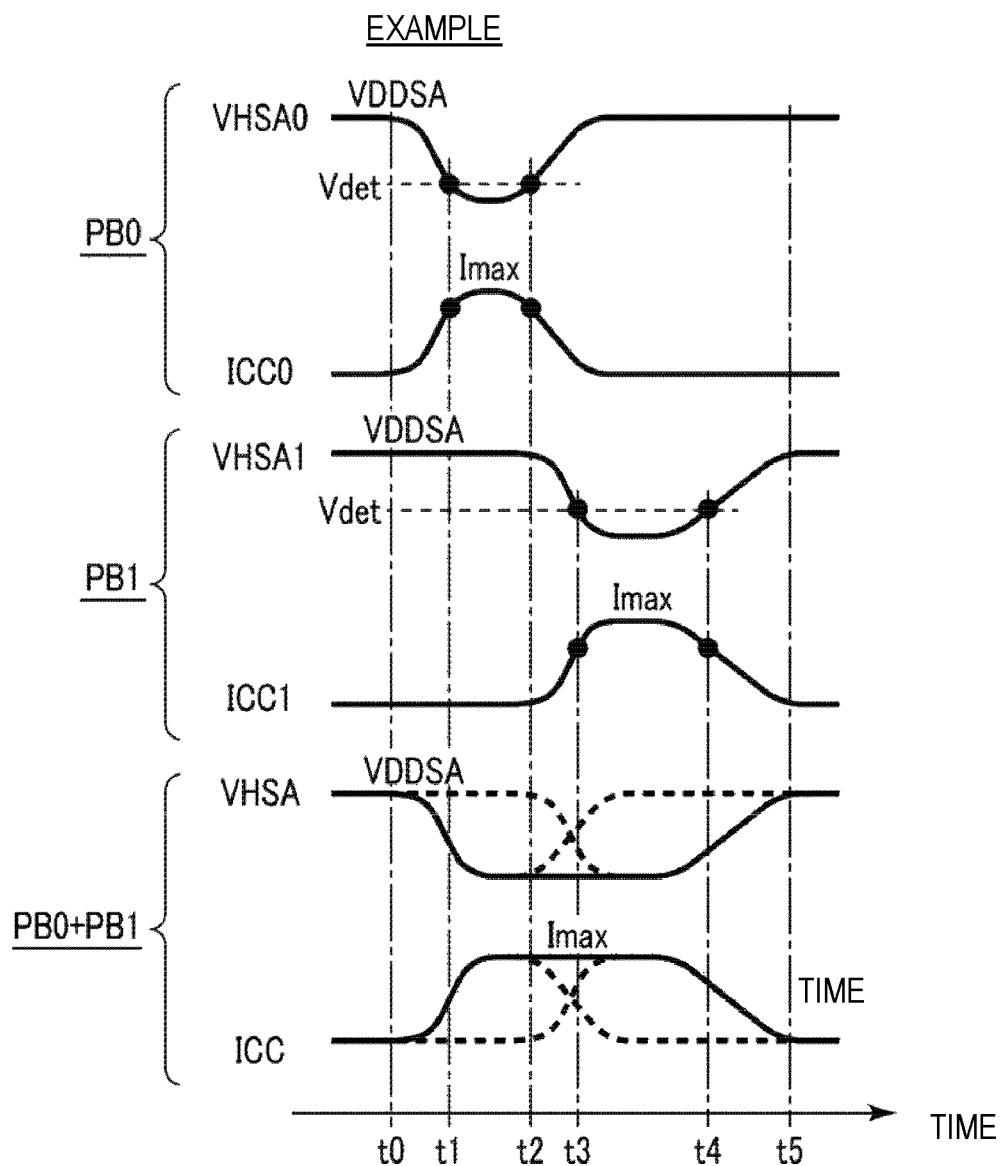
FIG. 17 is a timing chart for the charging operation of the bit line according to the second embodiment.

FIG. 17 is a timing chart for explaining the charging operation of the bit line according to the second embodiment. FIG. 17 illustrates (1) the voltage VHSA0 and the current consumption ICC0 in the plane PB0, (2) the voltage VHSA1 and the current consumption ICC1 in the plane PB1, and (3) the voltage VHSA and the current consumption ICC at the time of simultaneously operating the planes PB0 and PB1.

The voltages VHSA0 and VHSA1 are set to the voltage VDDSA. At a point of time t0, the sequencer 24 starts the charging of the bit line BL in the plane PB0. In addition, the VHSASLOW setting circuit 52-0 controls the variable current source 53-0 so that the maximum current Imax may flow to the plane PB0. When the charging of the bit line BL in the plane PB0 is started, the current consumption ICC0 is gradually increased, and the voltage VHSA0 is gradually decreased. At a point of time t1, the voltage VHSA0 becomes lower than the voltage Vdet. The VHSA detection circuit 54-0 detects that the voltage VHSA0 becomes lower than the voltage Vdet. Thereafter, as the charging of the bit line BL proceeds, the current consumption ICC0 is gradually decreased, and the voltage VHSA0 is gradually increased.

At a point of time t2, the voltage VHSA0 becomes equal to or higher than the voltage Vdet. The VHSA detection circuit 54-0 detects that the voltage VHSA0 becomes equal to or higher than the voltage Vdet. When the VHSA detection circuit 54 detects that the voltage VHSA0 temporarily becomes lower than the voltage Vdet and then returns to the level equal to or higher than the voltage Vdet, the sequencer 24 starts the charging of the bit line BL in the plane PB1. In addition, the VHSASLOW setting circuit 52-1 controls the variable current source 53-1 so that the maximum current Imax may flow to the plane PB1. When the charging of the bit line BL in the plane PB1 is started, the current consumption ICC1 is gradually increased, and the voltage VHSA1 is gradually decreased. At a point of time t3, the voltage VHSA1 becomes lower than the voltage Vdet. Thereafter, as the charging of the bit line BL proceeds, the current consumption ICC1 is gradually decreased, and the voltage VHSA1 is gradually increased. At a point of time t4, the voltage VHSA1 becomes equal to or higher than the voltage Vdet.

The charging of the bit line ends in the order of the plane PB0 and the plane PB1. As described above, the sequencer 24 detects that the voltage VHSA0 becomes equal to or lower than the voltage Vdet and then becomes equal to or higher than the voltage Vdet again after the charging of the bit line BL in the plane PB0 is started, and as a result, the sequencer 24 detects that the charging of the bit line BL in the plane PB0 is coming to an end, and starts the charging of the bit line BL in the plane PB1. As a result, as illustrated in FIG. 17, since the current consumption ICC1 of the plane PB1 decreases as the current consumption ICC0 of the plane PB0 is increased, the current consumption ICC of the entire chip hardly drops at all from the maximum current Imax. Further, the charging of the bit line in the 2-plane operation may also be performed in the order of the plane PB1 and the plane PB0.

(Comparative Example)

Figure 18:
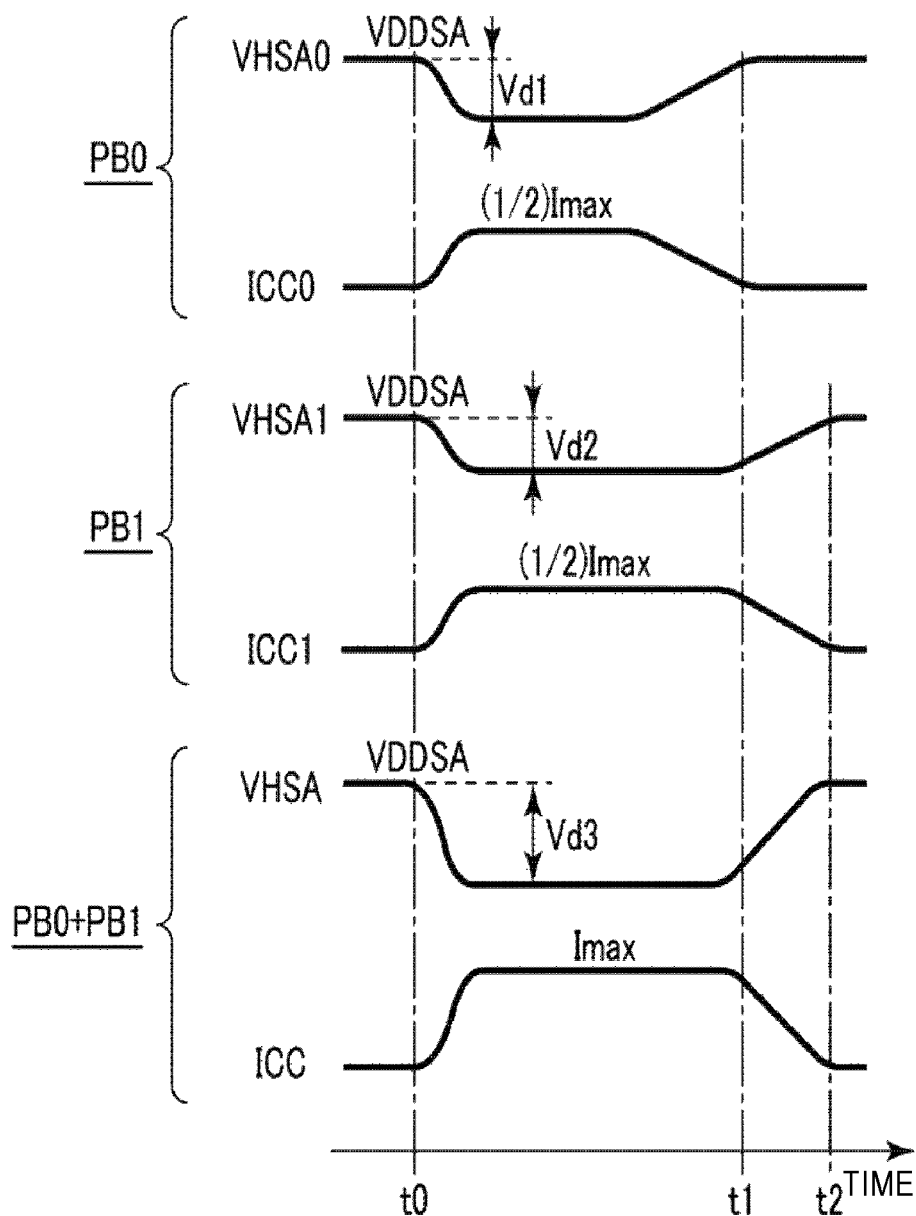
FIG. 18 is a timing chart for a charging operation of a bit line according to a Comparative Example.

FIG. 18 is a timing chart for explaining the charging operation of the bit line according to the Comparative Example.

At a point of time t0, the charging of the bit line BL in the plane PB0 and the charging of the bit line BL in the plane PB1 are simultaneously started. In addition, in the Comparative Example, the current (½) Imax is set in the planes PB0 and PB1. The voltage VHSA0 drops by a voltage Vd1, and the voltage VHSA1 drops by a voltage Vd2. A voltage drop Vd3 in FIG. 18 is approximately "Vd1+Vd2".

The BL charging time of the plane PB0 and the BL charging time of the plane PB1 vary based on the number of bit lines BL to be charged for the plane. For example, the charging of the bit line BL in the plane PB0 ends at the point of time t1, and the charging of the bit line BL in the plane PB1 ends at the point of time t2.

In the comparative example, the operation needs to be on standby until the charging of the plane PB1 ends, and the next operation may be started after the charging of the plane PB1 ends. In the example in FIG. 18, the standby time is a period of t1 to t2.

In the Example in FIG. 17, the BL charging of the plane PB1 is started before the BL charging of the plane PB0 ends. Therefore, in comparison with the Comparative Example, the Example may reduce the BL charging time to the extent of the period between the points of time t2 and t3 in FIG. 17, that is, the time at which the BL charging of the plane PB0 and the BL charging of the plane PB1 overlap each other.

(Effect of Second Embodiment)

According to the second embodiment, it is possible to reduce the charging time of the bit line even in the case in which the planes PB0 and PB1 operate in parallel. Therefore, it is possible to reduce the time related to the program operation.

[3] Third Embodiment

In a third embodiment, the current, which flows to each of the two planes PB, is set to the current (½) Imax, and the charging of the bit line is started in the two planes PB in parallel. However, after the charging of the bit line in one plane PB has approximately ended, the current which flows to the other plane PB is increased to the current Imax.

Figure 19:
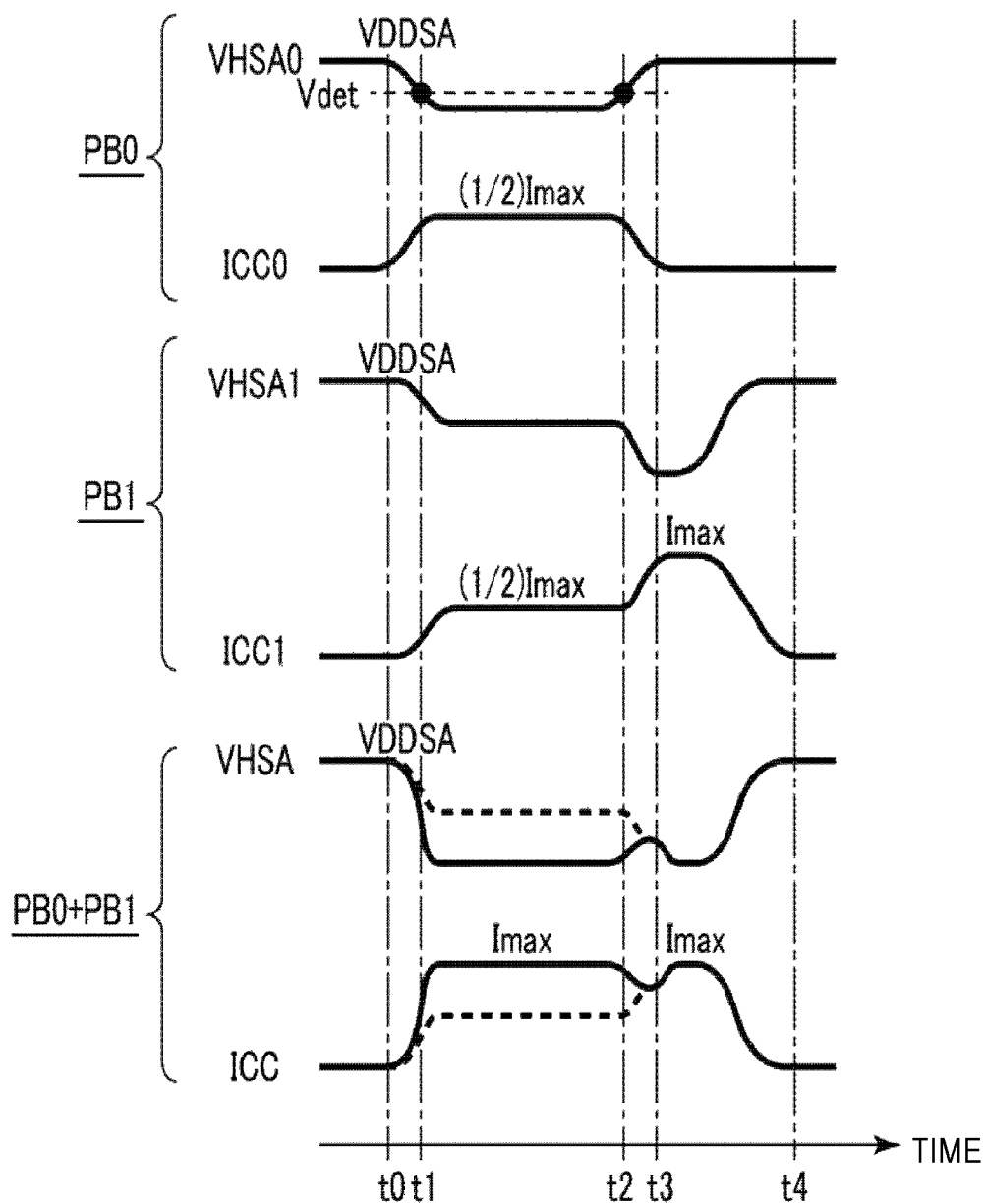
FIG. 19 is a timing chart for a charging operation of a bit line according to a third embodiment.

FIG. 19 is a timing chart for explaining the charging operation of the bit line according to the third embodiment. FIG. 19 illustrates an Example of the 2-plane operation.

At a point of time t0, the sequencer 24 starts the charging of the bit line BL in the planes PB0 and PB1 in parallel. In addition, the VHSASLOW setting circuits 52-0 and 52-1 control the variable current sources 53-0 and 53-1, respectively, so that the maximum value of the current which may flow to the planes PB0 and PB1, becomes the current (½)Imax.

When the charging of the bit line BL in the plane PB0 is started, the voltage VHSA0 is gradually decreased. At a point of time t1, the voltage VHSA0 becomes lower than the voltage Vdet. Further, the voltage Vdet in the third embodiment need not be equal to the voltage Vdet in the second embodiment and may be appropriately set. Thereafter, the voltage VHSA0 is gradually increased as the charging of the bit lines BL in the plane PB0 ends.

At a point of time t2, the voltage VHSA0 becomes equal to or higher than the voltage Vdet. The VHSA detection circuit 54-0 detects that the voltage VHSA0 becomes equal to or higher than the voltage Vdet. In the case in which the voltage VHSA0 returns to the level equal to or higher than the voltage Vdet, the VHSASLOW setting circuit 52-1 controls the variable current source 53-1 so that the maximum current Imax may flow to the plane PB1.

Thereafter, the charging of the bit line in the plane PB0 ends at a point of time t3, and the charging of the bit line in the plane PB1 ends at a point of time t4.

In a case in which the BL charging of the plane PB1 ends prior to the BL charging of the plane PB0, the waveforms of the plane PB0 and the plane PB1 in FIG. 19 are switched. That is, the sequencer 24 performs the control so that the maximum current Imax flows to the plane PB0 when the voltage VHSA1 returns to the level equal to or higher than the voltage Vdet.

According to the third embodiment, it is possible to reduce the charging time of the bit lines even in the case in which the planes PB0 and PB1 operate in parallel. Therefore, it is possible to reduce the time related to the program operation.

[4] Fourth Embodiment

In the read operation, the current for charging the non-selected word line WL to which the voltage VREAD is applied also causes an increase in current consumption. If the charging of the bit line BL in the program operation and the charging of the non-selected word line WL in the read operation overlap each other, there may be a conflict with the designed maximum current Imax. In the fourth embodiment, for example, the current consumption of the plane PB0 varies in when the plane PB0 performs the write operation and the plane PB1 performs the read operation.

Figure 20:
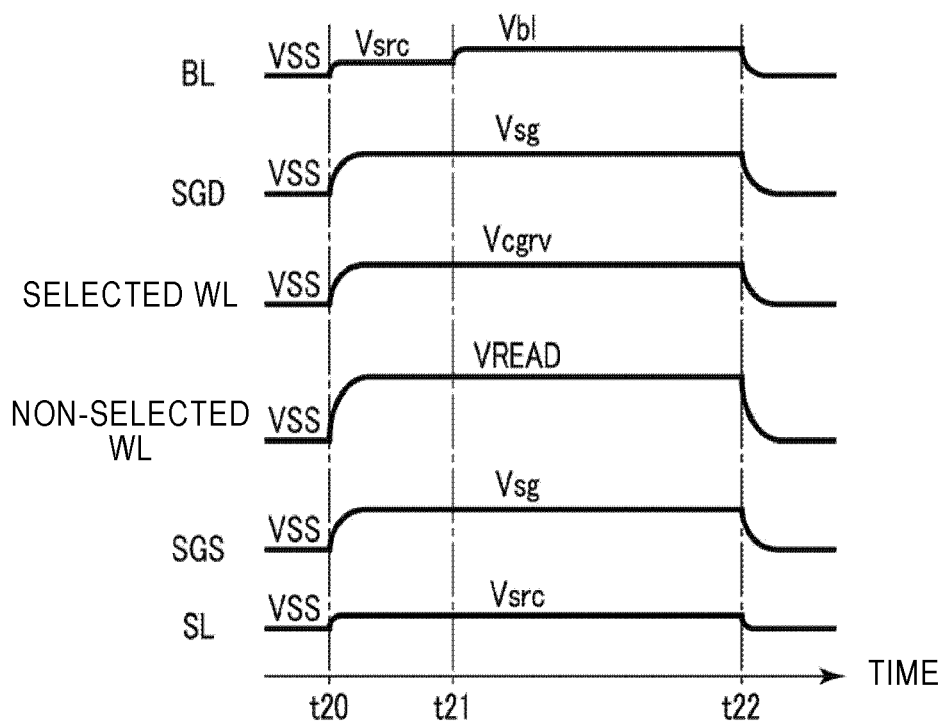
FIG. 20 is a timing chart for a read operation.

FIG. 20 is a timing chart for explaining the read operation.

At a point of time t20, a voltage Vsrc is applied to the source line SL. The voltage Vsrc satisfies the relationship VSS≤Vsrc<VDD. The sense amplifier unit 28 applies the voltage Vsrc to the bit line BL. The row decoder 26 applies a read voltage Vcgrv to the selected word line WL and applies the voltage VREAD to the non-selected word line WL. The read voltage Vcgrv is a voltage for determining a threshold value of a memory cell which is a target to be read, that is, data of the memory cell. In addition, the row decoder 26 applies a voltage Vsg to the select gate lines SGD and SGS. The voltage Vsg is a voltage for turning on the select transistors ST1 and ST2.

At a point of time t21, the sense amplifier unit 28 applies a voltage Vb1 to the bit line BL. The voltage Vb1 is a voltage for pre-charging the bit line BL before reading the data from the memory cell transistor, and the voltage Vb1 is about Vsrc+0.5V, for example.

Thereafter, the sense amplifier unit 28 determines the current of the bit line BL, thereby reading the data of the memory cell. Further, in a case in which a plurality of states are continuously read, the level of the read voltage Vcgrv is sequentially changed in accordance with the read state.

At a point of time t22, voltages of various types of wires are reset.

(Charging Operation of Bit Line)

Figure 21:
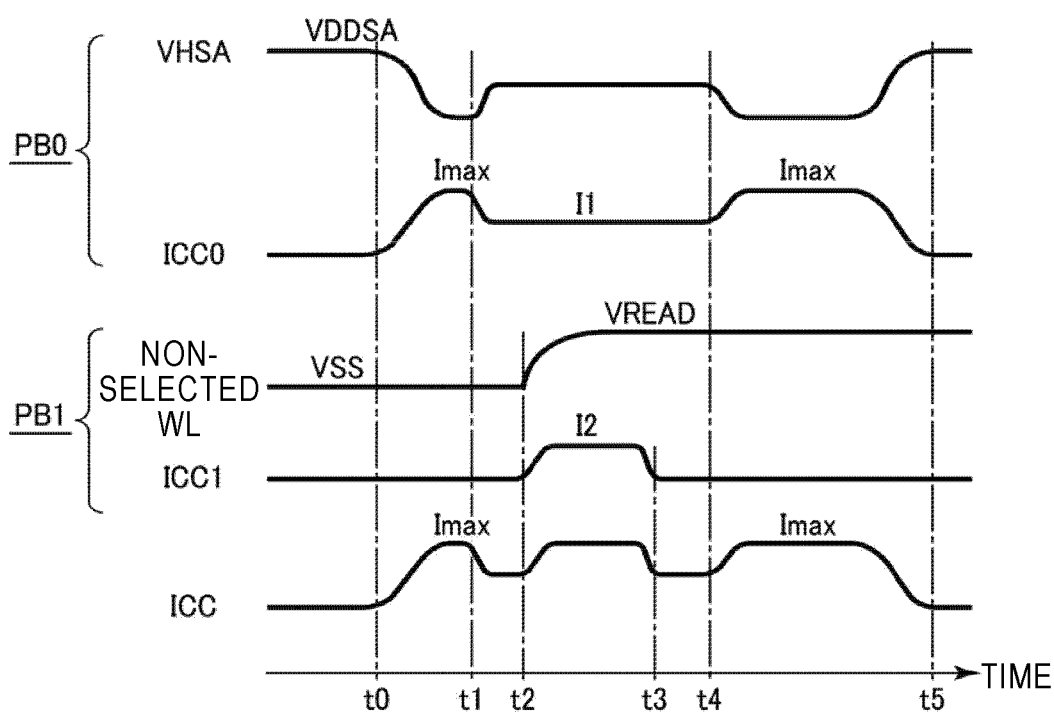
FIG. 21 is a timing chart for a charging operation of a bit line according to a fourth embodiment.

FIG. 21 is a timing chart for explaining the charging operation of the bit line according to the fourth embodiment. In the fourth embodiment, the planes PB0 and PB1 perform different operations in parallel. For example, the plane PB0 performs a program operation, and the plane PB1 performs a read operation. In FIG. 21, "ICC" schematically indicates a sum of the current consumed by the planes PB0 and PB1.

At the point of time t0, the sequencer 24 starts the charging of the bit line BL in the plane PB0. The VHSASLOW setting circuit 52-0 controls the variable current source 53-0 so that the maximum current Imax may flow to the plane PB0.

At a point of time t1, the sequencer 24 controls the VHSASLOW setting circuit 52-0 so that the current consumption of the plane PB0 becomes a current I1 (current I1<Imax). The VHSASLOW setting circuit 52-0 sets a DAC value, which corresponds to the current I1, as a signal VHSA_IREFP. A point of time t1 is prior to the time at which the charging of the non-selected word line WL is started.

At a point of time t2, the sequencer 24 starts the charging of the non-selected word line WL in the plane PB1. Therefore, the current consumption ICC1 of the plane PB1 is increased to a current I2. The current I2 varies in accordance with the number of word lines WL to be charged. At a point of time t3, the charging of the non-selected word line WL ends.

At a point of time t4, the sequencer 24 controls the VHSASLOW setting circuit 52-0 so that the current consumption of the plane PB0 becomes the current Imax. The VHSASLOW setting circuit 52-0 sets the DAC value which corresponds to the current Imax, as the signal VHSA_IREFP.

At a point of time t5, the charging of the bit line BL in the plane PB0 ends.

In the fourth embodiment, the charging operation of the voltage VREAD is described. However, the disclosure is not limited thereto and may also be applied to other charging current.

In the write operation, a program loop that includes the program operation of increasing the threshold voltage of the memory cell transistor by applying the program voltage Vpgm to the selected word line WL and a verification operation of verifying the threshold voltage of the memory cell transistor is repeated a plurality of times, and finally, the threshold voltage of the memory cell transistor is set to a target level. The number of bit lines to be charged varies in accordance with the number of loops. Therefore, whether to perform the varying of the charging current of the bit line may be changed in accordance with the number of loops. For example, the function may be performed at an intermediate portion among all the loops.

(Effect of Fourth Embodiment)

According to the fourth embodiment, the planes PB0 and PB1 may perform the control so that the current consumption of the NAND type flash memory 2 does not exceed the maximum current Imax even in the case in which the planes PB0 and PB1 perform the different operations in parallel.

It is possible to reduce the charging time of the bit line in a plane PB which performs the program operation.

[5] Modified Example

In the above embodiments, the operations of charging bit lines including the program operation are described as examples. However, the disclosure not limited thereto and may also be applied to operations other than the program operation as long as the operations are the operations of charging bit lines.

In the respective embodiments, the NAND type flash memory is described as an example, but the possible embodiments are not limited thereto and may also be applied to memories other than the NAND type flash memory.

According to a modified example (1) a semiconductor storage device includes: a first plane which includes a plurality of memory cells; a second plane which includes a plurality of memory cells; a plurality of first bit lines which are connected to the first plane; a plurality of second bit lines which are connected to the second plane; a plurality of first sense amplifiers which charge the plurality of first bit lines, respectively; and a plurality of second sense amplifiers which charge the plurality of second bit lines, respectively. When the first and second planes are operated in parallel, a total sum of currents supplied to the plurality of first bit lines from the plurality of first sense amplifiers and currents supplied to the plurality of second bit lines from the plurality of second sense amplifiers reaches a first current value, then decreases to a second current value, and then increases to a third current value.

In a modified Example (2), a semiconductor storage device includes: a power source voltage terminal to which a power source voltage is supplied; x planes (where x is an integer equal to or larger than 2) each of which includes a plurality of memory cells; x bit lines which are connected to the x planes, respectively; x sense amplifiers which are connected to the power source voltage terminal and charge the x bit lines, respectively, In modified Example (2) a maximum value Imax1 of a current which flows in the power source voltage terminal when a first command for operating the x planes in parallel is received and a maximum value Imax2 of a current which flows in the power source voltage terminal when a second command for operating y planes (where y is an integer smaller than x) from among the x planes in parallel is received will satisfy Imax2>(y/x) Imax1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a first plane which includes a first plurality of memory cells;
   a second plane which includes a second plurality of memory cells;
   a plurality of first bit lines which are connected to the first plane;
   a plurality of second bit lines which are connected to the second plane;
   a plurality of first sense amplifiers which charge the plurality of first bit lines; and
   a plurality of second sense amplifiers which charge the plurality of second bit lines, wherein
   when the first and second planes operate in parallel, a total sum of currents supplied to the plurality of first bit lines from the plurality of first sense amplifiers and currents supplied to the plurality of second bit lines from the plurality of second sense amplifiers reaches a first current value, then decreases to a second current value, and then increases to a third current value.

2. The semiconductor storage device according to claim 1, further comprising:
   a first variable current source which supplies a current to the plurality of first sense amplifiers;
   a second variable current source which supplies a current to the plurality of second sense amplifiers; and
   a detection circuit which detects a voltage of an output terminal of the first variable current source and determines whether the voltage of the output terminal is equal to or higher than a first voltage, wherein, when the first and second planes operate in parallel, a current Imax is supplied to the first plane at a start of a charging of the first plane, and when the voltage of the output terminal becomes lower than the first voltage and then returns to a level equal to or higher than the first voltage, the current Imax is supplied to the second plane at a start of a charging of the second plane, wherein the current Imax is a total maximum operating current for each of the first and second planes.

3. The semiconductor storage device according to claim 1, further comprising:

a first variable current source which supplies a current to the plurality of first sense amplifiers;

a second variable current source which supplies a current to the plurality of second sense amplifiers; and a detection circuit which detects a voltage of an output terminal of the first variable current source and determines whether the voltage of the output terminal is equal to or higher than a first voltage, wherein when the first and second planes operate in parallel, a current equal to (½)×current Imax is supplied to the first and second planes at a start of charging of the first and second planes, and when the voltage of the output terminal becomes lower than the first voltage and then returns to a level equal to or higher than the first voltage, the current Imax is then supplied to the second plane, wherein the current Imax is a total maximum operating current of the first and second planes.

4. The semiconductor storage device according to claim 1, wherein each plane includes a plurality of memory strings, each of the plurality of memory strings includes a plurality of memory cells connected in series, and one end of each memory string is connected to one bit line.

5. The semiconductor storage device according to claim 1, further comprising:

a control circuit configured to control an operation sequence according to a command received from a memory controller.

6. A semiconductor storage device, comprising:

a power source voltage terminal to which a power source voltage is supplied;

a plurality of planes each of which includes a plurality of memory cells, a total number of planes in the plurality of planes being equal to x, where x is an integer equal to or greater than two;

a plurality of bit lines which are respectively connected to the planes; and a plurality of sense amplifiers which are connected to the power source voltage terminal and respectively charge the bit lines, wherein a current which flows in the power source voltage terminal when a first command for operating all x planes in parallel is received is equal to a maximum value Imax1 and a current which flows in the power source voltage terminal when a second command for operating a subset of the x planes equal to y planes from among the x planes in parallel is a maximum value Imax2 and satisfies the relationship Imax2>(y/x) Imax1 when y is an integer value less than x.

7. The semiconductor storage device according to claim 6, wherein when first and second planes operate in parallel, a current (½)Imax is supplied to the first and second planes if a total maximum current of first and second planes is a current Imax.

8. The semiconductor storage device according to claim 7, wherein the first and second planes perform a write operation in parallel.

9. The semiconductor storage device according to claim 6, further comprising:

a first word line which is connected to a first plane; and
a second word line which is connected to a second plane, wherein, when a total maximum current of the first and second planes is equal to a current Imax and the first and second planes operate in parallel, then the current Imax is supplied to the first plane to start the charging of the plurality of first bit lines at a first point of time, a current smaller than the current Imax is supplied to the first plane at a second point of time subsequent to the first point of time, charging of the second word line is started at a third point of time subsequent to the second point of time, and the current Imax is again supplied to the first plane at a fourth point of time subsequent to the third point of time.

10. The semiconductor storage device according to claim 9, wherein the first plane performs a write operation and the second plane performs a read operation.

11. The semiconductor storage device according to of claim 6, wherein each plane includes a plurality of memory strings, each of the plurality of memory strings includes a plurality of memory cells connected in series, and one end of each memory string is connected to one bit line.

12. The semiconductor storage device according to claim 6, further comprising:

a control circuit configured to control an operation sequence according to a command received from a memory controller.

13. A method of controlling a semiconductor storage device, comprising:

receiving a command from a memory controller connected to the semiconductor storage device;

determining whether the command is for a multiple plane operation;

supplying a maximum current Imax to any one plane designated by the command when the command is not for the multiple plane operation; and supplying a current value equal to (1/x)×current Imax to any plane designated by the command when the command is for multiple plane operation, wherein x is equal to a total number of planes in the semiconductor storage device.

14. The method according to claim 13, wherein the total number of planes is two.

15. The method according to claim 13, wherein the command is a write command.

16. The method according to claim 13, wherein the maximum current Imax is supplied to charge bit lines of a designated plane in a single plane operation.

17. The method according to claim 13, wherein the maximum current Imax is equal to a manufacturing specification value for the semiconductor storage device.

18. The method according to claim 13, wherein the maximum current Imax is less than a manufacturing specification value for the semiconductor storage device.

19. The method according to claim 13, wherein the charging of bit lines of a second plane begins before a charging of bit lines of a first plane ends, and the combined current value supplied in the charging of the bit lines of the first and second planes does not exceed maximum current Imax.

20. The method according to claim 13, wherein when the command is for the multiple plane operation, a bit line charging current is increased to maximum current Imax for any bit lines connected to a first plane which has yet not completed charging if a second plane has already completed charging.

* * * * *